US012733424B2

(12) United States Patent
Kamimura

(10) Patent No.: US 12,733,424 B2
(45) Date of Patent: Sep. 8, 2026

(54) CLEANING LIQUID AND METHOD FOR CLEANING SEMICONDUCTOR SUBSTRATE

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 249 days.

(21) Appl. No.: 18/055,145

(22) Filed: Nov. 14, 2022

(65) Prior Publication Data

US 2023/0088854 A1 Mar. 23, 2023

Related U.S. Application Data

(63) Continuation of application No. PCT/JP2021/016639, filed on Apr. 26, 2021.

(30) Foreign Application Priority Data

May 15, 2020 (JP) ................................ 2020-086035

(51) Int. Cl.
*H10P 70/00* (2026.01)
*C09K 13/06* (2006.01)
*C11D 3/04* (2006.01)
*C11D 7/08* (2006.01)

(52) U.S. Cl.
CPC .............. *H10P 70/27* (2026.01); *C09K 13/06* (2013.01); *C11D 3/042* (2013.01); *C11D 7/08* (2013.01); *H10P 70/277* (2026.01); *C11D 2111/22* (2024.01)

(58) Field of Classification Search
CPC ........ H01L 21/00–86; C09D 1/00–945; C11D 3/00–507; C11D 7/00–5095; C11D 17/00–08; C11D 2111/00–48
See application file for complete search history.

(56) References Cited

U.S. PATENT DOCUMENTS

2009/0239777 A1* 9/2009 Angst .................... C11D 7/265 510/175
2012/0077422 A1* 3/2012 Yoshino ................... C09G 1/02 977/773
2017/0283673 A1* 10/2017 Zhou ..................... H01L 21/463
2020/0071642 A1* 3/2020 Thomas ............... C11D 3/3765
2020/0347299 A1 11/2020 Takahashi et al.
2020/0384416 A1 12/2020 Omatsu et al.

FOREIGN PATENT DOCUMENTS

JP 2001-240985 A 9/2001
JP 2014093407 A * 5/2014 ....... H01L 21/32134
JP 2014103179 A * 6/2014 ............. C09K 13/08
TW 201940998 A 10/2019
WO WO-2019138814 A1 * 7/2019 ............. C09K 13/06

OTHER PUBLICATIONS

Japanese Office Action dated Jan. 16, 2024 in Japanese Application No. 2022-521815.
International Search Report dated Jun. 15, 2021, issued in International Application No. PCT/JP2021/016639.
Written Opinion dated Jun. 15, 2021, issued in International Application No. PCT/JP2021/016639.
International Preliminary Report on Patentability (with translation of the written Opinion) dated Nov. 15, 2022, issued in International Application No. PCT/JP2021/016639.
Communication dated Oct. 1, 2024, issued in Taiwanese Application No. 110117361.
Communication dated Jan. 20, 2025 issued by the Korean Patent Office in application No. 10-2022-7039505.

* cited by examiner

*Primary Examiner* — Duy Vu N Deo
*Assistant Examiner* — Andrew Keelan Laobak
(74) *Attorney, Agent, or Firm* — Sughrue Mion, PLLC

(57) ABSTRACT

The present invention provides a cleaning liquid for a semiconductor substrate that has been subjected to CMP, in which the cleaning liquid has an excellent selectivity for $RuO_2$ removing performance; and a method for cleaning a semiconductor substrate that has been subjected to CMP. The cleaning liquid of an embodiment of the present invention is a cleaning liquid for a semiconductor substrate that has been subjected to a chemical mechanical polishing treatment, in which the cleaning liquid includes a perhalogen acid and a halogen acid.

19 Claims, No Drawings

CLEANING LIQUID AND METHOD FOR CLEANING SEMICONDUCTOR SUBSTRATE

CROSS-REFERENCE TO RELATED APPLICATIONS

This application is a Continuation of PCT International Application No. PCT/JP2021/016639 filed on Apr. 26, 2021, which claims priority under 35 U.S.C. § 119(a) to Japanese Patent Application No. 2020-086035 filed on May 15, 2020. The above application is hereby expressly incorporated by reference, in its entirety, into the present application.

BACKGROUND OF THE INVENTION

1. Field of the Invention

The present invention relates to a cleaning liquid and a method for cleaning a semiconductor substrate.

2. Description of the Related Art

In the manufacture of a semiconductor element, a chemical mechanical polishing (CMP) treatment in which a surface of a substrate having a metal wiring line film, a barrier metal, an insulating film, or the like is flattened using a polishing slurry including polishing fine particles (for example, silica and alumina) may be performed. In the CMP treatment, polishing fine particles to be used in the CMP treatment, a polished wiring line metal film, and/or a metal component derived from a barrier metal and the like easily remain on a surface of a semiconductor substrate after polishing.

Since these residues can short-circuit wiring lines and affect the electrical characteristics of a semiconductor, a cleaning step in which these residues are removed from a surface of the semiconductor substrate is generally performed.

For example, JP2001-240985A discloses a treatment liquid for an etching treatment for an Ru metal.

SUMMARY OF THE INVENTION

In recent years, a semiconductor substrate having an Ru wiring line has been further studied to accomplish a higher degree of integration, a higher speed, and the like of a semiconductor. In a step of producing a semiconductor substrate having an Ru wiring line, it has been required that $RuO_2$ be selectively removed during cleaning after CMP. Specifically, for a cleaning liquid in a cleaning step after CMP, it is desirable that maintain or improve a removal speed for $RuO_2$ formed on a surface of Ru during CMP while suppressing a removal speed for Ru which finally serves as a wiring line. That is, it has been required that the value of a speed ratio of the removal speed for $RuO_2$ to the removal speed for Ru be high. Hereinafter, the speed ratio of the removal speed for $RuO_2$ to the removal speed for Ru is also referred to as a selectivity for removal performance for $RuO_2$.

On the other hand, the present inventors have conducted studies on the treatment liquid for an etching treatment described in JP2001-240985A with respect to a semiconductor substrate including Ru, and have thus found that there is room for improvement on a selectivity for the removal performance for $RuO_2$ in a cleaning step after CMP.

An object of the present invention is to provide a cleaning liquid for a semiconductor substrate that has been subjected to CMP, in which the cleaning liquid has an excellent selectivity for removal performance for $RuO_2$.

In addition, another object of the present invention is to provide a method for cleaning a semiconductor substrate that has been subjected to CMP.

The present inventors have found that the objects can be accomplished by the following configurations.

[1] A cleaning liquid for a semiconductor substrate that has been subjected to a chemical mechanical polishing treatment, the cleaning liquid comprising:

a perhalogen acid; and a halogen acid.

[2] The cleaning liquid as described in [1], in which a pH value of the cleaning liquid is 2.0 to 12.0.

[3] The cleaning liquid as described in [1] or [2], in which a value of a mass ratio of a content of the perhalogen acid to a content of the halogen acid is 0.00001 to 50.

[4] The cleaning liquid as described in any one of [1] to [3], further comprising an organic base compound.

[5] The cleaning liquid as described in [4], in which the organic base compound includes at least one selected from the group consisting of a first amine compound represented by Formula (1) which will be described later, a quaternary ammonium compound, and a quaternary phosphonium compound.

[6] The cleaning liquid as described in any one of [1] to [5], further comprising an organic acid.

[7] The cleaning liquid as described in [6], in which the organic acid has at least one selected from the group consisting of a carboxyl group and a phosphonic acid group.

[8] The cleaning liquid as described in any one of [1] to [7], further comprising at least one selected from the group consisting of an anticorrosive agent, a surfactant, a polymer A having a weight-average molecular weight of 500 or more and less than 2,000, and a polymer B having a weight-average molecular weight of 2,000 or more.

[9] The cleaning liquid as described in any one of [1] to [8], further comprising an anticorrosive agent, in which the anticorrosive agent is a heterocyclic compound.

[10] The cleaning liquid as described in [9], in which the anticorrosive agent includes at least one selected from the group consisting of a tetrazole compound, a triazole compound, an imidazole compound, a pyrazole compound, and derivatives thereof.

[11] The cleaning liquid as described in any one of [1] to [10], further comprising a surfactant, in which the surfactant is an anionic or nonionic surfactant.

[12] The cleaning liquid as described in any one of [1] to [11], further comprising a polymer B having a molecular weight of 2,000 or more, in which the polymer B has a carboxyl group or an acid anhydride group.

[13] A method for cleaning a semiconductor substrate, comprising a step of cleaning a semiconductor substrate that has been subjected to a chemical mechanical polishing treatment, using the cleaning liquid as described in any one of [1] to [12].

According to the present invention, it is possible to provide a cleaning liquid for a semiconductor substrate that has been subjected to CMP, in which the cleaning liquid has an excellent selectivity for removal performance for $RuO_2$.

In addition, according to the present invention, it is possible to provide a method for cleaning a semiconductor substrate that has been subjected to CMP.

DESCRIPTION OF THE PREFERRED EMBODIMENTS

Hereinafter, an example of a form for carrying out the present invention will be described.

In the present specification, a numerical value range expressed using "to" means a range that includes the preceding and succeeding numerical values of "to" as the lower limit value and the upper limit value, respectively.

In the present specification, in a case where two or more kinds of a certain component are present, the "content" of the component means a total content of the two or more kinds of the component.

In the present specification, "ppm" means "parts-per-million ($10^{-6}$)", and "ppb" means "parts-per-billion ($10^{-9}$)".

The compounds described in the present specification may include isomers (compounds having the same number of atoms but having different structures), optical isomers, and isotopes thereof unless otherwise restricted. In addition, only one kind or a plurality of kinds of the isomers and the isotopes may be included.

In the present specification, psi means a pound-force per square inch; 1 psi=6,894.76 Pa.

The cleaning liquid of an embodiment of the present invention (hereinafter also simply referred to as a "cleaning liquid") is a cleaning liquid for a semiconductor substrate that has been subjected to a chemical mechanical polishing treatment (CMP), in which the cleaning liquid includes a perhalogen acid and a halogen acid.

The present inventors have found that by incorporating a perhalogen acid and a halogen acid into a cleaning liquid, a selectivity for removal performance for $RuO_2$ (hereinafter also described as "the effect of the present invention") in a cleaning liquid used in a cleaning step for a semiconductor substrate including Ru that has been subjected to CMP is improved, thereby completing the present invention.

A detailed mechanism by which the effect of the present invention can be obtained by such a cleaning liquid is unknown, but is presumed to be as follows: by incorporation of a perhalogen acid and a halogen acid, the perhalogen acid improves the removal performance for $RuO_2$ and the halogen acid suppresses the removal performance for Ru, resulting in expression of a high selectivity for $RuO_2$.

[Cleaning Liquid]

The cleaning liquid includes a perhalogen acid and a halogen acid.

Hereinafter, each component included in the cleaning liquid will be described.

[Perhalogen Acid]

The cleaning liquid of the embodiment of the present invention includes a perhalogen acid.

The perhalogen acid means a peroxide including a halogen atom.

Examples of the perhalogen acid include periodic acid, perchloric acid, perbromic acid, and salts thereof. Among those, the perhalogen acid is preferably periodic acid or perchloric acid is preferable, and more preferably periodic acid from the viewpoint that the effect of the present invention is more excellent.

The periodic acid is not particularly limited, but from the viewpoint that the effect of the present invention is more excellent, the periodic acid is preferably at least one selected from the group consisting of orthoperiodic acid ($H_5IO_6$), metaperiodic acid ($HIO_4$), and salts thereof, and more preferably orthoperiodic acid or metaperiodic acid. Orthoperiodic acid is still more preferable from the viewpoint that it does not includes an alkali metal such as sodium (Na) and the composition is stable.

Examples of the salt of the perhalogen acid include salts of alkali metals such as lithium, sodium, and potassium; salts of alkaline earth metals such as magnesium, calcium, and barium; and a salt of ammonium.

The perhalogen acid may be used alone or in combination of two or more kinds thereof.

The content of the perhalogen acid is preferably 0.00001 to 5% by mass, more preferably 0.0001 to 3% by mass, and still more preferably 0.0001% to 2.5% by mass with respect to a total mass of the cleaning liquid from the viewpoint that the effect of the present invention is more excellent.

In addition, the content of the perhalogen acid is preferably 0.0001% to 80% by mass, more preferably 0.001% to 75% by mass, and still more preferably 0.001% to 70% by mass with respect to the total mass of the components excluding the solvent the cleaning liquid from the viewpoint that the effect of the present invention is more excellent.

Furthermore, the total mass of the components excluding the solvent in the cleaning liquid means a total mass of the components (for example, perhalogen acid and halogen acid) other than the solvent such as water in the cleaning liquid.

[Halogen Acid]

The cleaning liquid of the embodiment of the present invention includes a halogen acid.

The halogen acid means an oxide including a halogen atom, having one less oxygen atoms than the above-mentioned perhalogen acid. That is, the halogen acid does not include a perhalogen acid and a hypohalogen acid.

Examples of the halogen acid include iodic acid, chloric acid, bromic acid, and salts thereof. Among those, the halogen acid is preferably iodic acid or chloric acid, and more preferably iodic acid from the viewpoint that the effect of the present invention is more excellent.

Examples of the salt of the halogen acid include salts of alkali metals such as lithium, sodium, and potassium, salts of alkaline earth metals such as magnesium, calcium, and barium, and a salt of ammonium.

The halogen acid may be used alone or in combination of two or more kinds thereof.

The content of the halogen acid is preferably 0.0005% to 4.5% by mass, more preferably 0.05% to 4.5% by mass, and still more preferably 3% to 4.5% by mass with respect to the total mass of the cleaning liquid from the viewpoint that the effect of the present invention is more excellent.

In addition, the content of the halogen acid is preferably 0.01% to 99.99% by mass, more preferably 1.0% to 85% by mass, and still more preferably 40% to 85% by mass with respect to the total mass of the components excluding the solvent cleaning liquid from the viewpoint that the effect of the present invention is more excellent.

The value of a mass ratio of the content of the perhalogen acid to the content of the halogen acid [the content of the perhalogen acid/the content of the halogen acid] is preferably 0.00001 to 5,000, more preferably 0.00001 to 50, still more preferably 0.00001 to 0.9, particularly preferably 0.0001 to 0.9, and most preferably 0.0003 to 0.5.

[pH Value]

The pH value of the cleaning liquid is preferably 1 to 14 at 25° C.

Among those, the pH value is preferably 2.0 to 12.0, and more preferably 4.0 to 12.0 from the viewpoint that the effect of the present invention is more excellent.

The pH value of the cleaning liquid can be adjusted by using a component having a function of a pH adjuster, such as a pH adjuster, an organic base compound, an organic acid, an anticorrosive agent, and a surfactant, which will be described later.

Furthermore, the pH value of the cleaning liquid can be measured by a method based on JIS Z8802-1984, using a known pH meter.

As will be described later, in a case where the cleaning liquid is diluted before use, it is preferable that the pH at the time of dilution is within the range.

[Optional Components]

The cleaning liquid may include other optional components, in addition to the above-mentioned components. Examples of the optional components include an organic base compound, an organic acid, an anticorrosive agent, a surfactant, a pH adjuster, various additives, and water.

The cleaning liquid preferably includes at least one selected from the group consisting of an organic base compound, an organic acid, a surfactant (more preferably an anionic surfactant), a pH adjuster, and a polymer.

The optional components may be used alone or in combination of two or more kinds thereof.

Hereinafter, the optional components will be described.

<Organic Base Compound>

The cleaning liquid may include an organic base compound (hereinafter also referred to as a "specific organic base compound").

The specific organic base compound means an organic compound that exhibits basicity in a case where it is dissolved in a solvent.

Examples of the specific organic base compound include a first amine compound, a second amine compound, and a quaternary phosphonium salt, which will be described later.

(First Amine Compound)

The cleaning liquid of the embodiment of the present invention may include a first amine compound represented by Formula (1) (hereinafter also referred to as a "first amine").

(1)

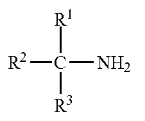

In Formula (1), $R^1$, $R^2$, and $R^3$ all represent organic groups. A plurality of $R^1$, $R^2$, and $R^3$ may be bonded to each other to form a non-aromatic ring which may have a substituent.

Examples of the organic group represented by each of $R^1$, $R^2$, and $R^3$ include an alkyl group, an alkenyl group, an alkynyl group, a cycloalkyl group, and an aryl group. These groups may have a substituent. Examples of the substituent include a hydroxyl group and an amino group. In addition, the alkyl group, the alkenyl group, and the alkynyl group may be linear or branched.

The number of carbon atoms of the organic group represented by each of $R^1$, $R^2$, and $R^3$ is not particularly limited, but is preferably 1 to 10, more preferably 1 to 5, and still more preferably 1 to 3.

The non-aromatic ring which may have a substituent, formed by bonding a plurality of $R^1$'s, $R^2$'s, and $R^3$'s to each other is not particularly limited, examples thereof include a cycloalkane ring having 5 to 10 carbon atoms, and the non-aromatic ring is preferably a cyclopentane ring, a cyclohexane ring, or a cycloheptane ring.

Examples of the substituent which may be contained in the non-aromatic ring include an alkyl group having 1 to 4 carbon atoms.

The organic group represented by each of $R^1$, $R^2$, and $R^3$ is preferably an alkyl group which may have a hydroxyl group, more preferably an alkyl group having 1 to 5 carbon atoms, which may have a hydroxyl group, still more preferably an alkyl group having 1 to 3 carbon atoms, which may have a hydroxyl group, and particularly preferably a methyl group or an ethyl group which may have a hydroxyl group.

Among those, a combination in which zero to two of $R^1$'s, $R^2$'s, and $R^3$'s are alkyl groups having a hydroxyl group, and the remaining one to three are alkyl groups having no hydroxyl group is more preferable.

It is preferable that the first amine includes a primary amino alcohol from the viewpoint that the temporal stability of the cleaning liquid is more excellent. That is, it is preferable that at least one of the organic groups represented by $R^1$, $R^2$, and $R^3$ in Formula (1) has a hydroxyl group.

For the primary amino alcohol, it is preferable that one or two of the organic groups represented by $R^1$, $R^2$, and $R^3$ have hydroxyl groups, and it is more preferable that one of the organic groups represented by $R^1$, $R^2$, and $R^3$ has a hydroxyl group.

The first acid dissociation constant (hereinafter also referred to as a "pKa1") of a conjugated acid of the first amine is preferably 8.5 or more. In a case where the pKa1 of the first amine is 8.5 or more, the pH of the cleaning liquid is more stable, and the cleaning performance and the corrosion prevention performance of the cleaning liquid are improved.

The pKa1 of the first amine is preferably 8.8 or more, and more preferably 9.0 or more from the viewpoint that the cleaning performance and the corrosion prevention performance are more excellent. The upper limit is not particularly limited, but is preferably 12.0 or less.

Examples of the primary amino alcohol include 2-amino-2-methyl-1-propanol (AMP) (pKa1: 9.72), 2-amino-2-methyl-1,3-dipropanol (AMPD) (pKa1: 8.80), and 2-amino-2-ethyl-1,3-dipropanol (AEPD) (pKa1: 8.80).

As the first amine, AMP, AMPD, or AEPD is preferable, and AMP is more preferable.

The first amine may be used alone or in combination of two or more kinds thereof.

The content of the first amine in the cleaning liquid is not particularly limited, but is preferably 0.05% by mass or more, more preferably 0.1% by mass or more, and still more preferably 0.5% by mass or more with respect to the total mass of the cleaning liquid. The upper limit is not particularly limited, but from the viewpoint that the corrosion prevention performance is more excellent, the upper limit is preferably 25% by mass or less, more preferably 15% by mass or less, still more preferably 10% by mass or less, and particularly preferably 5% by mass or less with respect to the total mass of the cleaning liquid.

In addition, the content of the first amine is preferably 1% by mass or more, more preferably 5% by mass or more, and still more preferably 10% by mass or more with respect to the total mass of the components excluding the solvent in the cleaning liquid from the viewpoint that the effect of the present invention is more excellent. The upper limit is not particularly limited, but from the viewpoint that the effect of the present invention is more excellent, the upper limit is preferably 50% by mass or less, more preferably 40% by mass or less, and still more preferably 35% by mass or less with respect to the total mass of the components excluding the solvent in the cleaning liquid.

(Second Amine Compound)

The cleaning liquid may include a second amine compound (hereinafter also referred to as a "second amine") that is different from the first amine.

Examples of the second amine include a primary aliphatic amine having a primary amino group ($—NH_2$) in the molecule, a secondary aliphatic amine having a secondary amino group (>NH) in the molecule, a tertiary aliphatic amine having a tertiary amino group (>N—) in the molecule, and a quaternary ammonium compound which is a compound having a quaternary ammonium cation or a salt thereof, and the quaternary ammonium compound is preferable.

—Quaternary Ammonium Compound—

The quaternary ammonium compound is not particularly limited as long as it is a compound having a quaternary ammonium cation in which a nitrogen atom is substituted with four hydrocarbon groups (preferably an alkyl group), or a salt thereof. Examples of the quaternary ammonium compound include a quaternary ammonium hydroxide, a quaternary ammonium fluoride, a quaternary ammonium bromide, a quaternary ammonium iodide, a quaternary ammonium acetate, and a quaternary ammonium carbonate. Among those, quaternary ammonium hydroxide is preferable.

As the quaternary ammonium compound, a quaternary ammonium hydroxide represented by Formula (2) is preferable.

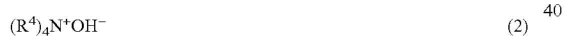

$$(R^4)_4N^+OH^- \quad (2)$$

In the formula, $R^4$ represents an alkyl group which may have a hydroxyl group or a phenyl group as a substituent. Four of $R^4$'s may be the same as or different from each other.

As the alkyl group represented by $R^4$, an alkyl group having 1 to 6 carbon atoms is preferable, and a propyl group or a butyl group is preferable.

As the alkyl group which may have a hydroxyl group or a phenyl group, represented by $R^4$, a methyl group, an ethyl group, a propyl group, a butyl group, a 2-hydroxyethyl group, or a benzyl group is preferable, the methyl group, the ethyl group, the propyl group, the butyl group, or the 2-hydroxyethyl group is more preferable, and the propyl group, the butyl group, or the 2-hydroxyethyl group is still more preferable.

Examples of the quaternary ammonium compound include tetraethylammonium hydroxide (TEAH), tetrapropylammonium hydroxide (TPAH), tetrabutylammonium hydroxide (TBAH), tetramethylammonium hydroxide (TMAH), trimethylethylammonium hydroxide (TMEAH), diethyldimethylammonium hydroxide (DEDMAH), methyltriethylammonium hydroxide (MTEAH), 2-hydroxyethyltrimethylammonium hydroxide (choline), bis(2-Hydroxyethyl)dimethylammonium hydroxide, tri (2-hydroxyethyl) methylammonium hydroxide, tetra(2-hydroxyethyl) ammonium hydroxide, benzyltrimethylammonium hydroxide (BTMAH), and cetyltrimethylammonium hydroxide.

As the quaternary ammonium compound other than the specific examples, for example, the compound described in paragraph of JP2018-107353A, the contents of which are incorporated herein by reference, can be used.

As the quaternary ammonium compound used in the cleaning liquid, for example, TEAH, TPAH, TBAH, TMAH, TMEAH, DED MAH, MTEAH, choline, or bis(2-hydroxyethyl)dimethylammonium hydroxide is preferable, DED MAH, MTEAH, TEAH, TPAH, or TBAH is more preferable, and TEAH, TPAH, or TBAH is still more preferable.

—Primary to Tertiary Aliphatic Amines—

Examples of the primary to tertiary aliphatic amines include a compound having a group selected from the group consisting of a primary amino group, a secondary amino group, and a tertiary amino group in the molecule (which may hereinafter be collectively referred to "primary to tertiary amino groups") or a salt thereof, which is not particularly limited as long as it does not have an aromatic ring and is not included in the first amine.

Examples of salts of the primary to tertiary aliphatic amines include a salt with an inorganic acid in which at least one non-metal selected from the group consisting of Cl, S, N, and P is bonded to hydrogen, and a hydrochloride, a sulfate, or a nitrate is preferable.

Examples of the primary to tertiary aliphatic amines include an amino alcohol, an alicyclic amine compound, and an aliphatic monoamine compound, and an aliphatic polyamine compound other than the amino alcohol and the alicyclic amine.

=Amino Alcohol=

The amino alcohol is a compound which further has at least one hydroxylalkyl group in the molecule among the primary to tertiary aliphatic amines. The amino alcohol may have any of primary to tertiary amino groups, but preferably has the primary amino group.

Examples of the amino alcohol included in the primary to tertiary aliphatic amines include monoethanolamine (MEA), diethanolamine (DEA), triethanolamine (TEA), diethylene glycolamine (DEGA), trishydroxymethylaminomethane (Tris), 2-(methylamino)-2-methyl-1-propanol (N-MAMP), 2-(aminoethoxy) ethanol (AEE), and 2-(2-aminoethylamino) ethanol (AAE).

Among those, N-MAMP, MEA, DEA, AEE, or AAE is preferable, and N-MAMP, MEA, or AEE is more preferable. In addition, MEA, DEA, AEE, or AAE is more preferable from the viewpoint that the cleaning performance is excellent.

=Alicyclic Amine Compound=

The alicyclic amine compound is not particularly limited as long as it is a compound having a non-aromatic heterocyclic ring in which at least one of the atoms constituting the ring is a nitrogen atom.

Examples of the alicyclic amine compound include a cyclic amidine compound and a piperazine compound.

The cyclic amidine compound is a compound having a heterocyclic ring including an amidine structure (>N—C═N—) in the ring.

The number of ring members of the heterocyclic ring contained in the cyclic amidine compound is not particularly limited, but is preferably 5 or 6, and more preferably 6.

Examples of the cyclic amidine compound include diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimid[1,2-a]azocine, 3,4,6,7,8,9-hexahydro-2H-pyrido[1,2-a]pyrimidine, 2,5,6,7-tetrahydro-3H-pyrrolo[1,2-a]imidazole, 3-ethyl-2,3,4,6,7,8,9,10-octahydropyrimid[1,2-a]azepine, and creatinine, and DBU is preferable.

The piperazine compound is a compound having a hetero-6-membered ring (piperazine ring) in which the opposite —CH— group of a cyclohexane ring is substituted with a nitrogen atom.

The piperazine compound may have a substituent on the piperazine ring. Examples of such a substituent include a hydroxyl group, an alkyl group having 1 to 4 carbon atoms, which may have a hydroxyl group, and an aryl group having 6 to 10 carbon atoms.

As the piperazine compound, for example, piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 1-phenylpiperazine, 2-hydroxypiperazine, 2-hydroxymethylpiperazine, 1-(2-hydroxyethyl) piperazine (HEP), N-(2-aminoethyl) piperazine (AEP), 1,4-bis(2-hydroxyethyl) piperazine (BHEP), 1,4-bis(2-aminoethyl) piperazine (BAEP), and 1,4-bis(3-aminopropyl) piperazine (BAPP), and piperazine, 1-methylpiperazine, 2-methylpiperazine, HEP, AEP, BHEP, BAEP, or BAPP is preferable.

Other examples of the alicyclic amine compound include a compound having a non-aromatic, hetero-5-membered ring such as 1,3-dimethyl-2-imidazolidinone and imidazolidinethione, and a compound having a 7-membered ring, including a nitrogen atom.

=Aliphatic Monoamine Compound=

The aliphatic monoamine compound other than the amino alcohol and the alicyclic amine is not particularly limited as long as it is a compound not included in the first amine, and examples thereof include methylamine, ethylamine, propylamine, dimethylamine, diethylamine, n-butylamine, 3-methoxypropylamine, tert-butylamine, n-hexylamine, cyclohexylamine, n-octylamine, 2-ethylhexylamine, and 4-(2-aminoethyl) morpholine (AEM).

=Aliphatic Polyamine Compound=

Examples of the aliphatic polyamine compound other than the amino alcohols and the alicyclic amines include alkylenediamines such as ethylenediamine (EDA), 1,3-propanediamine (PDA), 1,2-propanediamine, 1,3-butanediamine, and 1, 4-butanediamine, and polyalkylpolyamines such as diethylenetriamine (DETA), triethylenetetramine (TETA), bis(aminopropyl)ethylenediamine (BAPEDA), and tetraethylenepentamine.

In addition, as the primary to tertiary aliphatic amines, the compounds not included in the first amine among the compounds described in paragraphs to of WO2013/162020A, the contents of which are incorporated herein by reference, can be used.

The primary to tertiary aliphatic amines preferably have one or more hydrophilic groups in addition to one amino group among the primary to tertiary aliphatic amines. Examples of the hydrophilic group include primary to tertiary amino groups and a hydroxyl group. Examples of the primary to tertiary aliphatic amines having one or more hydrophilic groups in addition to one amino group among the primary to tertiary aliphatic amines include an amino alcohol, an aliphatic polyamine compound, and a compound having two or more hydrophilic groups among alicyclic amine compounds, and the amino alcohol or the cyclic amidine compound is preferable.

The upper limit of the total number of the hydrophilic groups contained in the primary to tertiary aliphatic amines is not particularly limited, but is preferably 4 or less, and more preferably 3 or less.

The number of primary to tertiary amino groups contained in the primary to tertiary aliphatic amines is not particularly limited, but is preferably 1 to 4, and more preferably 1 to 3.

In addition, the molecular weight of the primary to tertiary aliphatic amines is not particularly limited, but is preferably 200 or less, and more preferably 150 or less. The lower limit is not particularly limited, but is preferably 60 or more.

The first acid dissociation constant (pKa1) of a conjugated acid of the second amine is preferably 8.5 or more, more preferably 8.6 or more, and still more preferably 8.7 or more from the viewpoint that the temporal stability of the cleaning liquid is further improved. The upper limit is not particularly limited, but is preferably 20.0 or less.

As the second amine, primary to tertiary aliphatic amines corresponding to a quaternary ammonium compound, an amino alcohol, or a cyclic amidine compound are preferable, TEAH (pKa1: >14.0), TPAH (pKa1: >14.0), TBAH (pKa1: >14.0), N-MAMP (pKa1: 9.72), MEA (pKa1: 9.50), DEA (pKa1: 8.70), AEE (pKa1: 10.60), AAE (pKa1: 10.80), DEDMAH (pKa1: >14.0), MTEAH (pKa1: >14.0), or DBU is more preferable, TEAH, TPAH, TBAH, N-MAMP, MEA, AEE, MTEAH, or DBU is still more preferable, and TEAH, TPAH, TBAH, or DBU is particularly preferable.

The second amine may be used alone or in combination of two or more kinds thereof. The cleaning liquid preferably includes two or more kinds of the second amines.

In a case where the cleaning liquid includes two or more kinds of the second amines, the cleaning liquid preferably includes one or more amino alcohols or primary to tertiary aliphatic amines corresponding to an alicyclic amine compound, and one or more quaternary ammonium compounds, and more preferably includes a combination of the compounds described as the preferred specific examples of each compound.

The content of the second amine in the cleaning liquid is preferably 0.05% by mass or more, more preferably 0.1% by mass or more, and still more preferably 1% by mass or more with respect to the total mass of the cleaning liquid. Moreover, the upper limit of the content of the second amine is preferably 20% by mass or less, more preferably 15% by mass or less, and still more preferably 10% by mass or less with respect to the total mass of the cleaning liquid from the viewpoint that the corrosion prevention properties of the metal film is excellent.

In addition, the content of the second amine is preferably 1% by mass or more, more preferably 5% by mass or more, and still more preferably 10% by mass or more with respect to the total mass of the components excluding the solvent in the cleaning liquid from the viewpoint that the effect of the present invention is more excellent. The upper limit is not particularly limited, but from the viewpoint that the effect of the present invention is more excellent, the upper limit is preferably 50% by mass or less, more preferably 40% by mass or less, and still more preferably 35% by mass or less with respect to the total mass of the components excluding the solvent in the cleaning liquid.

(Quaternary Phosphonium Salt)

Examples of the quaternary phosphonium salt include a tetraalkylphosphonium salt, a trialkylarylphosphonium salt, a dialkyldiarylphosphonium salt, an alkyltriarylphosphonium salt, and a tetraarylphosphonium salt.

Examples of the anion contained in the quaternary phosphonium salt include halogen ions (for example, $F^-$, $Cl^-$, $Br^-$, and $I^-$), hydroxide ions, nitrate ions, nitrite ions, hypochlorite ions, chlorite ions, chlorate ions, perchlorate ions, acetate ions, hydrogen carbonate ions, phosphate ions, sulfate ions, hydrogen sulfate ions, sulfite ions, thiosulfate ions, and carbonate ions.

Examples of the quaternary phosphonium salt include a methyltriphenylphosphonium salt, an ethyltriphenylphosphonium salt, a triphenylpropylphosphonium salt, an a butyltriphenylphosphonium salt, isopropyltriphenylphosphonium salt, pentyltriphenylphosphonium salt, a hexyltriphenylphosphonium salt, an heptyldiphenylphosphonium salt, a triphenyl(tetradecyl)phosphonium salt, tetraphenylphosphonium salt, a benzyltriphenylphosphonium salt, a (2-hydroxybenzyl)triphenylphosphonium salt, a (2-chlorobenzyl)triphenylphosphonium salt, a (4-chlorobenzyl)triphenylphosphonium salt, a (2,4-dichlorobenzyl)phenylphosphonium salt, a (4-nitrobenzyl)triphenylphosphonium salt, a 4-ethoxybenzyltriphenylphosphonium salt, a (1-naphthylmethyl)triphenylphosphonium salt, a (cyanomethyl)triphenylphosphonium salt, a (methoxymethyl)triphenylphosphonium salt, a (formylmethyl)triphenylphosphonium salt, an acetonyltriphenylphosphonium salt, a phenacyltriphenylphosphonium salt, methoxycarbonylmethyl(triphenyl) phosphonium salt, an ethoxycarbonylmethyl(triphenyl) phosphonium salt, a (3-carboxypropyl)triphenylphosphonium salt, a (4-carboxybutyl)triphenylphosphonium salt, a 2-dimethylaminoethyltriphenylphosphonium salt, a triphenylvinylphosphonium salt, an allyltriphenylphosphonium salt, and a triphenylpropargylphosphonium salt.

The quaternary phosphonium salt may be used alone or in combination of two or more kinds thereof.

The content of the quaternary phosphonium salt in the cleaning liquid is not particularly limited, but is preferably 0.05% by mass or more, more preferably 0.1% by mass or more, and still more preferably 1% by mass or more with respect to the total mass of the cleaning liquid. The upper limit is not particularly limited, but from the viewpoint that the corrosion prevention performance is more excellent, the upper limit is preferably 25% by mass or less, more preferably 15% by mass or less, still more preferably 10% by mass or less, and particularly preferably 5% by mass or less with respect to the total mass of the cleaning liquid.

In addition, the content of the quaternary phosphonium salt is preferably 1% by mass or more, more preferably 5% by mass or more, and still more preferably 10% by mass or more with respect to the total mass of the components excluding the solvent in the cleaning liquid from the viewpoint that the effect of the present invention is more excellent. The upper limit is not particularly limited, but from the viewpoint that the effect of the present invention is more excellent, the upper limit is preferably 50% by mass or less, more preferably 40% by mass or less, and still more preferably 35% by mass or less with respect to the total mass of the components excluding the solvent in the cleaning liquid.

As the specific organic base compound, at least one compound selected from the group consisting of a first amine, a second amine, and a quaternary phosphonium salt is preferable, and AMP, TEAH, TPAH, TBAH, or DBU is more preferable.

The specific organic base compound may be used alone or in combination of two or more kinds thereof.

The content of the specific organic base compound is not particularly limited, but is preferably 0.05% by mass or more, more preferably more than 0.1% by mass, and still more preferably 1% by mass or more with respect to the total mass of the cleaning liquid. The upper limit is not particularly limited, but from the viewpoint that the effect of the present invention is more excellent, the upper limit is preferably 25% by mass or less, more preferably 15% by mass or less, still more preferably 10% by mass or less, and particularly preferably 5% by mass or less with respect to the total mass of the cleaning liquid.

In addition, the content of the specific organic base compound is preferably 1% by mass or more, more preferably 5% by mass or more, and still more preferably 10% by mass or more with respect to the total mass of the components excluding the solvent in the cleaning liquid from the viewpoint that the effect of the present invention is more excellent. The upper limit is not particularly limited, but from the viewpoint that the effect of the present invention is more excellent, the upper limit is preferably 50% by mass or less, more preferably 40% by mass or less, and still more preferably 35% by mass or less with respect to the total mass of the components excluding the solvent in the cleaning liquid.

<Organic Acid>

An organic acid is an organic compound that has an acidic functional group and is acidic (with a pH of less than 7.0) in an aqueous solution. Examples of the acidic functional group include a carboxyl group, a phosphonic acid group, a sulfo group, a phenolic hydroxyl group, and a mercapto group, and the carboxylic acid or the phosphonic acid is preferable.

Furthermore, in the present specification, the compound functioning as an anionic surfactant, which will be described later, is not included in the organic acid.

The organic acid is not particularly limited, but examples thereof include a carboxylic acid having a carboxyl group in the molecule (carboxylic acid), a phosphonic acid having a phosphonic acid group in the molecule (phosphonic acid), and a sulfonic acid having a sulfo group in the molecule (sulfonic acid), and the carboxylic acid or the phosphonic acid is preferable.

The number of acidic functional groups contained in the organic acid is not particularly limited, but is preferably 1 to 10, more preferably 2 to 9, and still more preferably 3 to 8.

In addition, the organic acid is preferably a compound having a function of chelating with a metal included in the residue, and more preferably a compound having two or more functional groups (coordinating groups) that coordinate with a metal ion in the molecule from the viewpoint that the cleaning performance is excellent. Examples of the coordinating group include the acidic functional groups, and the carboxylic acid group or the phosphonic acid group is preferable.

(Carboxylic Acid)

The carboxylic acid may be a monocarboxylic acid having one carboxyl group or a polycarboxylic acid having 2 or more carboxyl groups. From the viewpoint that the cleaning performance is more excellent, the carboxylic acid preferably has 2 or more carboxyl groups, more preferably 2 to 7 carboxyl groups, and still more preferably 3 to 6 carboxyl groups.

Examples of the carboxylic acid include an aminopolycarboxylic acid, a hydroxycarboxylic acid, an amino acid, and an aliphatic carboxylic acid.

—Aminopolycarboxylic Acid—

The aminopolycarboxylic acid is a compound having one or more amino groups and two or more carboxyl groups as the coordinating group in the molecule.

Examples of the aminopolycarboxylic acid include diethylenetriamine pentaacetic acid (DTPA), ethylenediaminetetraacetic acid (EDTA), aspartic acid, glutamic acid, butylenediaminetetraacetic acid, ethylenediaminetetrapropionic acid, triethylenetetraaminehexaacetic acid, 1,3-diamino-2-hydroxypropane-N,N,N',N'-tetraacetic acid, propylenediaminetetraacetic acid, trans-1,2-diaminocyclohexanetetraacetic acid (CyDTA), ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanetetraacetic acid, 1,4,7,10-tetraazacyclododecane-tetraacetic acid, diaminopropanoltetraacetic acid, (hydroxyethyl)ethylenediaminetriacetic acid, and iminodiacetic acid (IDA).

Among those, DTPA, EDTA, CyDTA, or IDA is preferable, and DTPA or EDTA is more preferable.

—Hydroxycarboxylic Acid—

The hydroxycarboxylic acid is a compound having one or more hydroxyl groups and one or more carboxyl groups in the molecule.

It is preferable that the cleaning liquid includes a hydroxycarboxylic acid from the viewpoint that the effect of the present invention is more excellent.

As the hydroxycarboxylic acid, for example, citric acid, malic acid, glycolic acid, gluconic acid, heptonic acid, tartaric acid, and lactic acid; and citric acid, gluconic acid, glycolic acid, malic acid, or tartaric acid is preferable, citric acid or gluconic acid is more preferable, and citric acid is still more preferable.

—Amino Acid—

The amino acid is a compound that has one carboxyl group and one or more amino groups in the molecule.

Examples of the amino acid include glycine, serine, α-alanine (2-aminopropionic acid), β-alanine (3-aminopropionic acid), lysine, leucine, isoleucine, cysteine, methionine, ethionine, threonine, tryptophan, tyrosine, valine, histidine, a histidine derivative, asparagine, glutamine, arginine, proline, phenylalanine, the compounds described in paragraphs to of JP2016-086094A, and salts thereof. Incidentally, as the histidine derivative, the compounds described in JP2015-165561A, JP2015-165562A, and the like, the contents of which are incorporated herein by reference, can be used.

In addition, examples of the salt include alkali metal salts such as a sodium salt and a potassium salt, an ammonium salt, a carbonate, and acetate.

Among those, a sulfur-containing amino acid including a sulfur atom is preferable. Examples of the sulfur-containing amino acid include cystine, cysteine, ethionine, and methionine, and cystine or cysteine is preferable.

—Aliphatic Carboxylic Acid—

Examples of the aliphatic carboxylic acid include oxalic acid, malonic acid, succinic acid, glutaric acid, adipic acid, pimelic acid, sebacic acid, and maleic acid, and adipic acid is preferable. In particular, by using adipic acid, the performance (cleaning performance and corrosion prevention properties) of the cleaning liquid can be significantly improved, as compared with other chelating agents. Although the detailed mechanism of such a specific effect of adipic acid is unknown, it is expected that the mechanism is derived from formation of a ring structure that has particularly excellent hydrophilicity and hydrophobicity in the relationship between an alkylene group and a carboxyl group having 2 carbon chains, and is stable in formation of a complex with a metal.

Examples of the carboxylic acids other than the aminopolycarboxylic acid, the hydroxycarboxylic acid, the amino acid, and the aliphatic carboxylic acid include monocarboxylic acids.

Examples of the monocarboxylic acids include lower (1 to 4 carbon atoms) aliphatic monocarboxylic acids such as formic acid, acetic acid, propionic acid, and butyric acid.

As the carboxylic acid, aminopolycarboxylic acid or hydroxycarboxylic acid is preferable, and DTPA, EDTA, or citric acid is more preferable.

The carboxylic acid may be used alone or in combination of two or more kinds thereof.

The content of the carboxylic acid in the cleaning liquid is not particularly limited, but is preferably 10% by mass or less, and more preferably 5% by mass or less with respect to the total mass of the cleaning liquid. The lower limit is not particularly limited, but is preferably 0.01% by mass or more, and more preferably 0.05% by mass or more with respect to the total mass of the cleaning liquid.

In addition, the content of the carboxylic acid is preferably 40% by mass or less, and more preferably 10% by mass or less with respect to the total mass of the components excluding the solvent in the cleaning liquid from the viewpoint that the effect of the present invention is more excellent. The lower limit is not particularly limited, but is preferably 0.001% by mass or more, and more preferably 0.01% by mass or more with respect to the total mass of the components excluding the solvent in the cleaning liquid.

(Phosphonic Acid)

The phosphonic acid may be a monophosphonic acid having one phosphonic acid group or a polyphosphonic acid having two or more phosphonic acid groups. From the viewpoint that the cleaning performance is more excellent, the polyphosphonic acid having two or more phosphonic acid groups is preferable.

Examples of the polyphosphonic acid include a compound represented by Formula (P1), a compound represented by Formula (P2), and a compound represented by Formula (P3).

(P1)

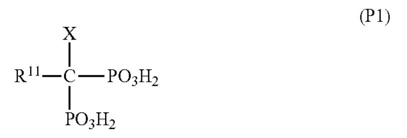

In the formulae, X represents a hydrogen atom or a hydroxyl group, and $R^{11}$ represents a hydrogen atom or an alkyl group having 1 to 10 carbon atoms.

The alkyl group having 1 to 10 carbon atoms represented by $R^{11}$ in Formula (P1) may be linear, branched, or cyclic.

As $R^{11}$ in Formula (P1), an alkyl group having 1 to 6 carbon atoms is preferable, and a methyl group, an ethyl group, an n-propyl group, or an isopropyl group is more preferable.

Furthermore, in the specific examples of the alkyl group described in the present specification, n-represents a normal-form.

As X in Formula (P1), a hydroxyl group is preferable.

As the compound represented by Formula (P1), 1-hydroxyethylidene-1,1'-diphosphonic acid (HEDP), ethylidene diphosphonic acid, 1-hydroxypropylidene-1,1'-diphosphonic acid, or 1-hydroxybutylidene-1,1'-diphosphonic acid is preferable, and HEDP is more preferable.

(P2)

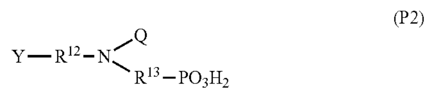

In the formula, Q represents a hydrogen atom or $R^{13}$—$PO_3H_2$, $R^{12}$ and $R^{13}$ each independently represent an alkylene group, and Y represents a hydrogen atom, —$R^{13}$—$PO_3H_2$, or a group represented by Formula (P4).

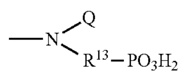

(P4)

In the formula, Q and $R^{13}$ are the same as Q and $R^{13}$ in Formula (P2), respectively.

Examples of the alkylene group represented by $R^{12}$ in Formula (P2) include a linear or branched alkylene group having 1 to 12 carbon atoms.

The alkylene group represented by $R^{12}$ is preferably a linear or branched alkylene group having 1 to 6 carbon atoms, more preferably a linear or branched alkylene group having 1 to 4 carbon atoms, and still more preferably an ethylene group.

Examples of the alkylene group represented by $R^{13}$ in Formulae (P2) and (P4) include a linear or branched alkylene group having 1 to 10 carbon atoms; and a linear or branched alkylene group having 1 to 4 carbon atoms is preferable, a methylene group or an ethylene group is more preferable, and the methylene group is still more preferable.

As Q in Formulae (P2) and (P4), —$R^{13}$—$PO_3H_2$ is preferable.

As Y in Formula (P2), —$R^{13}$—$PO_3H_2$ or the group represented by Formula (P4) is preferable, and the group represented by Formula (P4) is more preferable.

As the compound represented by Formula (P2), ethylaminobis(methylenephosphonic acid), dodecylaminobis(methylenephosphonic acid), nitrilotris(methylenephosphonic acid) (NTPO), ethylenediamine bis(methylenephosphonic acid) (EDDPO), 1,3-propylenediamine bis(methylenephosphonic acid), ethylenediaminetetra(methylenephosphonic acid) (EDTPO), ethylenediaminetetra(ethylenephosphonic acid), 1,3-propylenediaminetetra(methylenephosphonic acid) (PDTMP), 1,2-diaminopropanetetra(methylenephosphonic acid), or 1,6-hexamethylenediaminetetra(methylenephosphonic acid) is preferable.

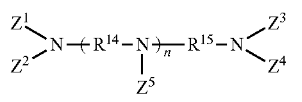

(P3)

In the formula, $R^{14}$ and $R^{15}$ each independently represent an alkylene group having 1 to 4 carbon atoms, n represents an integer of 1 to 4, and at least four of $Z^1$, . . . , or $Z^4$, or n pieces of $Z^5$'s represent an alkyl group having a phosphonic acid group, and the others each represent an alkyl group.

The alkylene group having 1 to 4 carbon atoms represented by each of $R^{14}$ and $R^{15}$ in Formula (P3) may be linear or branched. Examples of the alkylene group having 1 to 4 carbon atoms represented by each of $R^{14}$ and $R^{15}$ include a methylene group, an ethylene group, a propylene group, a trimethylene group, an ethylmethylene group, a tetramethylene group, a 2-methylpropylene group, a 2-methyltrimethylene group, and an ethylethylene group, and the ethylene group is preferable.

n in Formula (P3) is preferably 1 or 2.

Examples of the alkyl group in the alkyl group and the alkyl group having phosphonic acid groups, represented by each of $Z^1$ to $Z^5$ in Formula (P3), include a linear or branched alkyl group having 1 to 4 carbon atoms, and a methyl group is preferable.

The number of phosphonic acid groups in the alkyl group having phosphonic acid groups, represented by each of $Z^1$ to $Z^5$, is preferably 1 or 2, and more preferably 1.

Examples of the alkyl group having phosphonic acid groups, represented by each of $Z^1$ to $Z^5$, include a linear or branched alkyl group having 1 to 4 carbon atoms and having one or two phosphonic acid groups; and a (mono)phosphonomethyl group or a (mono)phosphonoethyl group is preferable, and the (mono)phosphonomethyl group is more preferable.

As $Z^1$ to $Z^5$ in Formula (P3), it is preferable that all of $Z^1$ to $Z^4$ and n pieces of $Z^5$'s are the alkyl groups having phosphonic acid groups.

As the compound represented by Formula (P3), diethylenetriamine penta(methylenephosphonic acid) (DEPPO), diethylenetriamine penta(ethylenephosphonic acid), triethylenetetramine hexa(methylenephosphonic acid), and triethylenetetramine hexa(ethylenephosphonic acid) is preferable.

Examples of the polyphosphonic acid used in the cleaning liquid include not only the compound represented by Formula (P1), the compound represented by Formula (P2), and the compound represented by Formula (P3), but also the compounds described in paragraphs [0026] to [0036] of WO2018/020878A and the compounds ((co) polymers) described in paragraphs [0031] to [0046] of WO2018/030006A, the contents of which are incorporated herein by reference, can be used.

The number of phosphonic acid groups contained in the phosphonic acid is preferably 2 to 5, more preferably 2 to 4, and still more preferably 2 or 3.

In addition, the phosphonic acid preferably has 12 or less carbon atoms, more preferably has 10 or less carbon atoms, and still more preferably 8 or less carbon atoms. The lower limit is not particularly limited, and is preferably 1 or more.

As the phosphonic acid, the compounds listed as suitable specific examples in each of the compound represented by Formula (P1), the compound represented by Formula (P2), and the compound represented by Formula (P3) described above are preferable, and HEDP is more preferable.

The phosphonic acid may be used alone or in combination of two or more kinds thereof.

The content of the phosphonic acid in the cleaning liquid is not particularly limited, but is preferably 2% by mass or less, and more preferably 1% by mass or less with respect to the total mass of the cleaning liquid. The lower limit is not particularly limited, but is preferably 0.01% by mass or more, and more preferably 0.05% by mass or more with respect to the total mass of the cleaning liquid.

In addition, the content of the phosphonic acid is preferably 40% by mass or less, and more preferably 10% by mass or less with respect to the total mass of the components excluding the solvent in the cleaning liquid from the viewpoint that the effect of the present invention is more excellent. The lower limit is not particularly limited, but is preferably 0.001% by mass or more, and more preferably 0.01% by mass or more with respect to the total mass of the components excluding the solvent in the cleaning liquid.

As the organic acid, at least one selected from the group consisting of aminopolycarboxylic acid, hydroxycarboxylic acid, and phosphonic acid is preferable, and DTPA, EDTA, citric acid, or HEDP is more preferable.

The organic acid preferably has a low molecular weight. Specifically, the molecular weight of the organic acid is preferably 600 or less, more preferably 450 or less, and still more preferably 300 or less. The lower limit is not particularly limited, but is preferably 85 or more.

In addition, the number of carbon atoms of the organic acid is preferably 15 or less, more preferably 12 or less, and still more preferably 8 or less. The lower limit is not particularly limited, but is preferably 2 or more.

The organic acid may be used alone or in combination of two or more kinds thereof. The cleaning liquid preferably includes two or more kinds of organic acids from the viewpoint that the cleaning performance is excellent.

The content of the organic acid in the cleaning liquid is not particularly limited, but is preferably 10% by mass or less, and more preferably 5% by mass or less with respect to the total mass of the cleaning liquid. The lower limit is not particularly limited, but is preferably 0.01% by mass or more, and more preferably 0.05% by mass or more with respect to the total mass of the cleaning liquid.

In addition, the content of the organic acid is preferably 40% by mass or less, and more preferably 10% by mass or less with respect to the total mass of the components excluding the solvent in the cleaning liquid from the viewpoint that the effect of the present invention is more excellent. The lower limit is not particularly limited, but is preferably 0.001% by mass or more, and more preferably 0.01% by mass or more with respect to the total mass of the components excluding the solvent in the cleaning liquid.

<Anticorrosive Agent>

The cleaning liquid may include an anticorrosive agent.

Furthermore, as the anticorrosive agent, a component different from the above-described component is preferable.

Examples of the anticorrosive agent include an anticorrosive agent having no reducing action, such as a heterocyclic compound having a heterocyclic structure and a phosphoric acid ester-based surfactant; an anticorrosive agent having a reducing action, such as a biguanide compound, an ascorbic acid compound, a hydroxylamine compound, a catechol compound, a hydrazide compound, a reducing sulfur compound, and a hydroxycarboxylic acid; and derivatives thereof. Among those, as the anticorrosive agent, the anticorrosive agent having no reducing action is preferable, and the heterocyclic compound or the phosphoric acid ester-based surfactant is more preferable.

The anticorrosive agent having a reducing action is a compound having an oxidizing action and having a function of oxidizing OH-ions or dissolved oxygen included in the cleaning liquid, and is also referred to as a deoxidizing agent.

—Heterocyclic Compound—

The heterocyclic compound is a compound having a heterocyclic structure in the molecule. The heterocyclic structure which the heterocyclic compound has is not particularly limited, and examples thereof include a heterocyclic ring in which at least one of the atoms constituting the ring is a nitrogen atom (nitrogen-containing heterocyclic ring), which is a compound other than the above-described components.

Examples of the heterocyclic compound having the nitrogen-containing heterocyclic ring include a nitrogen-containing heteroaromatic compound such as an azole compound. The azole compound is a compound having a hetero-5-membered ring that includes at least one nitrogen atom and has aromaticity.

The number of nitrogen atoms contained in the hetero-5-membered ring of the azole compound is not particularly limited and is preferably 1 to 4, and more preferably 1 to 3.

In addition, all of these azole compounds may have substituents on the hetero-5-membered ring. Examples of such a substituent include a hydroxyl group, a carboxyl group, a mercapto group, an amino group, an alkyl group having 1 to 4 carbon atoms, which may have an amino group, and a 2-imidazolyl group.

Examples of the azole compound include an imidazole compound in which one of the atoms constituting the azole ring is a nitrogen atom, a pyrazole compound in which two of the atoms constituting an azole ring are nitrogen atoms, and a thiazole compound in which one of the atoms constituting an azole ring is a nitrogen atom and the other is a sulfur atom, a triazole compound in which three of the atoms constituting an azole ring are nitrogen atoms, and a tetrazole compound in which four of the atoms constituting an azole ring are nitrogen atoms.

Examples of the imidazole compound include imidazole, 1-methylimidazole, 2-methylimidazole, 5-methylimidazole, 1,2-dimethylimidazole, 2-mercaptoimidazole, 4,5-dimethyl-2-mercaptoimidazole, 4-hydroxyimidazole, 2,2'-biimidazole, 4-imidazole carboxylic acid, histamine, benzoimidazole, and a purine base (adenine and the like).

Examples of the pyrazole compound include 3-amino-5-methylpyrazole, pyrazole, 4-pyrazolecarboxylic acid, 1-methylpyrazole, 3-methylpyrazole, 3-amino-5-hydroxypyrazole, 3-aminopyrazole, and 4-aminopyrazole.

Examples of the thiazole compound include 2,4-dimethylthiazole, benzothiazole, and 2-mercaptobenzothiazole.

Examples of the triazole compound include 1,2,4-triazole, 1-bis(2-hydroxyethyl)aminomethyl-5-methyl-1H benzotriazole, 1-bis(2-hydroxyethyl)aminomethyl-4-methyl-1H-benzotriazole, 3-methyl-1,2,4-triazole, 3-amino-1,2,4-triazole, 1,2,3-triazole, 1-methyl-1,2,3-triazole, benzotriazole, 1-hydroxybenzotriazole, 1-dihydroxypropylbenzotriazole, 2,3-dicarboxypropylbenzotriazole, 4-hydroxybenzotriazole, 4-carboxybenzotriazole, and 5-methylbenzotriazole.

Examples of the tetrazole compound include 1H-tetrazole (1,2,3,4-tetrazole), 5-methyl-1,2,3,4-tetrazole, 5-amino-1,2,3,4-tetrazole, 1,5-pentamethylenetetrazole, 1-phenyl-5-mercaptotetrazole, and 1-(2-dimethylaminoethyl)-5-mercaptotetrazole.

As the azole compound, the imidazole compound, the pyrazole compound, the triazole compound, or the tetrazole compound is preferable, the pyrazole compound or the triazole compound is more preferable, and 3-amino-5-methylpyrazole, 1,2,4-triazole, 1-bis(2-hydroxyethyl)aminomethyl-5-methyl-1H benzotriazole, or 1-bis(2-hydroxyethyl)aminomethyl-4-methyl-1H-benzotriazole is still more preferable.

—Phosphoric Acid Ester-Based Surfactant—

Examples of the phosphoric acid ester-based surfactants include a phosphoric acid ester (an alkyl ether phosphoric acid ester and an aryl ether phosphoric acid ester), a polyoxyalkylene ether phosphoric acid ester (a polyoxyalkylene alkyl ether phosphoric acid ester and a polyoxyalkylene aryl ether phosphoric acid ester), and salts thereof. The phosphoric acid ester and the polyoxyalkylene ether phosphoric acid usually include both a monoester and a diester, but the monoester or the diester alone can be used alone.

Examples of the salt of the phosphoric acid ester-based surfactant include a sodium salt, a potassium salt, an ammonium salt, and an organic amine salt.

The alkyl group contained in the phosphoric acid ester and the polyoxyalkylene ether phosphoric acid ester is not particularly limited, but is preferably an alkyl group having 2 to 24 carbon atoms, more preferably an alkyl group having 6 to 22 carbon atoms, and still more preferably an alkyl group having 10 to 20 carbon atoms.

The aryl group contained in the phosphoric acid ester and the polyoxyalkylene ether phosphoric acid ester is not particularly limited, but is preferably an aryl group having 6 to 14 carbon atoms, which may have an alkyl group, and more preferably a phenyl group which may have an alkyl group.

The divalent alkylene group contained in the polyoxyalkylene ether phosphoric acid ester is not particularly limited, but is preferably an alkylene group having 2 to 6 carbon atoms, and more preferably an ethylene group. In addition, the number of repetitions of the oxyalkylene group in the polyoxyalkylene ether phosphoric acid ester is preferably 1 to 12, and more preferably 3 to 10.

Examples of the phosphoric acid ester-based surfactant include an octyl phosphoric acid ester, a lauryl phosphoric acid ester, a tridecyl phosphoric acid ester, a myristyl phosphoric acid ester, a cetyl phosphoric acid ester, a stearyl phosphoric acid ester, a polyoxyethylene octyl ether phosphoric acid ester, a polyoxyethylene lauryl ether phosphoric acid ester, a polyoxyethylene tridecyl ether phosphoric acid ester, or a polyoxyethylene dimethylphenyl ether phosphoric acid ester. Among those, the phosphoric acid ester-based surfactant is preferably polyoxyethylene dimethylphenyl ether phosphoric acid ester.

As the phosphoric acid ester-based surfactant, the compounds described in paragraphs [0012] to [0019] of JP2011-040502A, the contents of which are incorporated herein by reference, can also be used.

—Biguanide Compound—

The biguanide compound is a biguanide compound which is a compound having a biguanide group or a salt thereof. The number of biguanide groups contained in the biguanide compound is not particularly limited, and the biguanide compound may have a plurality of biguanide groups.

Examples of the biguanide compound include the compounds described in paragraphs [0034] to [0055] of JP2017-504190A, the contents of which are incorporated herein by reference.

As the compounds having a biguanide group, ethylene dibiguanide, propylene dibiguanide, tetramethylene dibiguanide, pentamethylene dibiguanide, hexamethylene dibiguanide, heptamethylene dibiguanide, octamethylene dibiguanide, 1,1'-hexamethylene bis(5-(p-chlorophenyl) biguanide)(chlorhexidine), 2-(benzyloxymethyl)pentane-1,5-bis(5-hexylbiguanide), 2-(phenylthiomethyl)pentane-1,5-bis(5-phenetylbiguanide), 3-(phenylthio)hexane-1,6-bis(5-hexylbiguanide), 3-(phenylthio)hexane-1,6-bis(5-cyclohexylbiguanide), 3-(benzylthio)hexane-1,6-bis(5-hexylbiguanide), or 3-(benzylthio)hexane-1,6-bis(5-cyclohexylbiguanide) is preferable, and chlorhexidine is more preferable.

As the salt of the compound having a biguanide group, hydrochloride, acetate or gluconate is preferable, and gluconate is more preferable.

As the biguanide compound, chlorhexidine gluconate (CHG) is preferable.

—Ascorbic Acid Compound—

The ascorbic acid compound means at least one selected from the group consisting of ascorbic acid, an ascorbic acid derivative, and salts thereof.

Examples of the ascorbic acid derivative include an ascorbic acid phosphoric acid ester and an ascorbic acid sulfuric acid ester.

As the ascorbic acid compound, the ascorbic acid, the ascorbic acid phosphoric acid ester, or the ascorbic acid sulfuric acid ester is preferable, and ascorbic acid is more preferable.

—Hydroxylamine Compound—

The hydroxylamine compound means at least one selected from the group consisting of hydroxylamine ($NH_2OH$), a hydroxylamine derivative, and salts thereof. In addition, the hydroxylamine derivative means a compound in which at least one organic group is substituted with hydroxylamine ($NH_2OH$).

The salt of the hydroxylamine or the hydroxylamine derivative may be an inorganic acid salt or an organic acid salt of the hydroxylamine or the hydroxylamine derivative. As the salt of the hydroxylamine or the hydroxylamine derivative, a salt of an inorganic acid in which at least one non-metal selected from the group consisting of Cl, S, N, and P is bonded to hydrogen is preferable, and a hydrochloride, a sulfate, or a nitrate is more preferable.

Examples of the hydroxylamine compound include a compound represented by Formula (3) or a salt thereof.

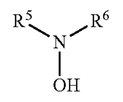

(3)

In Formula (3), $R^5$ and $R^6$ each independently represent a hydrogen atom or an organic group.

As the organic group represented by each of $R^5$ and $R^6$, an alkyl group having 1 to 6 carbon atoms is preferable. The alkyl group having 1 to 6 carbon atoms may be linear, branched, or cyclic.

In addition, it is preferable that at least one of $R^5$ or $R^6$ is an organic group (more preferably an alkyl group having 1 to 6 carbon atoms).

As the alkyl group having 1 to 6 carbon atoms, an ethyl group or an n-propyl group is preferable, and the ethyl group is more preferable.

Examples of the hydroxylamine compound include hydroxylamine, O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxylamine, O,N,N-trimethylhydroxylamine, N,N-dicarboxyethylhydroxylamine and N,N-disulfoethylhydroxylamine.

Among those, N-ethylhydroxylamine, N,N-diethylhydroxylamine (DEHA), or N-n-propylhydroxylamine is preferable, and DEHA is more preferable.

—Catechol Compound—

The catechol compound means at least one selected from the group consisting of pyrocatechol (benzene-1,2-diol) and a catechol derivative.

The catechol derivative means a compound in which at least one substituent is substituted in pyrocatechol. As the substituent contained in the catechol derivative, a hydroxyl group, a carboxyl group, a carboxylic acid ester group, a sulfo group, a sulfonic acid ester group, an alkyl group (preferably having 1 to 6 carbon atoms, and more preferably having 1 to 4 carbon atoms), and an aryl group (preferably a phenyl group). The carboxyl group and the sulfo group contained as a substituent in the catechol derivative may be a salt with a cation. In addition, the alkyl group and the aryl group contained as a substituent in the catechol derivative may further have a substituent.

Examples of the catechol compound include pyrocatechol, 4-tert-butylcatechol, pyrogallol, gallate, methyl gallate, 1,2,4-benzenetriol, and Tyrone.

—Hydrazide Compound—

The hydrazide compound means a compound having a hydroxyl group of an acid substituted with a hydrazino group (—NH—$NH_2$), and a derivative thereof (a compound having at least one substituent substituted in a hydrazino group).

The hydrazide compound may have two or more hydrazino groups.

Examples of the hydrazide compound include carboxylic acid hydrazide and sulfonic acid hydrazide, and carbohydrazide (CHZ) is preferable.

—Reducing Sulfur Compound—

The reducing sulfur compound is not particularly limited as long as it is a compound including a sulfur atom and having a function as a reducing agent, and examples thereof include mercaptosuccinic acid, dithiodiglycerol, bis(2,3-dihydroxypropylthio)ethylene, sodium 3-(2,3-dihydroxypropylthio)-2-methyl-propylsulfonate, 1-thioglycerol, sodium 3-mercapto-1-propanesulfonate, 2-mercaptoethanol, thioglycolic acid, and 3-mercapto-1-propanol.

Among those, a compound having an SH group (mercapto compound) is preferable, and cysteine, 1-thioglycerol, sodium 3-mercapto-1-propanesulfonate, 2-mercaptoethanol, 3-mercapto-1-propanol, or thioglycolic acid is more preferable, and cysteine is still more preferable.

—Other Anticorrosive Agents—

The cleaning liquid may include another anticorrosive agent other than the above-mentioned respective components.

Examples of such another anticorrosive agent include sugars such as fructose, glucose and ribose; polyols such as ethylene glycol, propylene glycol, and glycerin; polyvinylpyrrolidone, cyanuric acid, barbituric acid and a derivative thereof, glucuronic acid, squaric acid, α-ketoic acid, adenosine and a derivative thereof, phenanthroline, resorcinol, hydroquinone, nicotine amide and a derivative thereof, flavonol and a derivative thereof, anthocyanin and a derivative thereof, and a combination thereof.

The anticorrosive agent preferably includes a heterocyclic compound or a phosphoric acid ester-based surfactant, and more preferably includes at least one selected from the group consisting of a tetrazole compound, a triazole compound, an imidazole compound, a pyrazole compound, and derivatives thereof.

The anticorrosive agent may be used alone or in combination of two or more kinds thereof.

From the viewpoint that the corrosion prevention performance is more excellent, the cleaning liquid preferably includes two or more kinds of anticorrosive agents, and more preferably includes three or more kinds of anticorrosive agents.

The content of the anticorrosive agent is preferably 0.01% to 20% by mass, more preferably 0.1% to 10% by mass, and still more preferably 0.3% to 5% by mass with respect to the total mass of the cleaning liquid.

In addition, the content of the anticorrosive agent is preferably 0.1% to 40% by mass, more preferably 1% to 30% by mass, and still more preferably 5% to 20% by mass with respect to the total mass of the components excluding the solvent in the cleaning liquid.

<Surfactant>

The cleaning liquid may include a surfactant other than the components.

The surfactant is not particularly limited as long as it is a compound having a hydrophilic group and a hydrophobic group (lipophilic group) in the molecule, examples thereof include an anionic surfactant, a nonionic surfactant, a cationic surfactant, and an amphoteric surfactant, and the anionic surfactant or the nonionic surfactant is preferable.

The surfactant often has a hydrophobic group selected from an aliphatic hydrocarbon group, an aromatic hydrocarbon group, and a combination thereof. The hydrophobic group contained in the surfactant is not particularly limited. In a case where the hydrophobic group includes the aromatic hydrocarbon group among those, the number of carbon atoms of the aromatic hydrocarbon group is preferably 6 or more, and more preferably 10 or more. The upper limit of the number of carbon atoms of the aromatic hydrocarbon group is not particularly limited, but is preferably 20 or less, and more preferably 18 or less.

In addition, in a case where the hydrophobic group does not include the aromatic hydrocarbon group and is composed of only the aliphatic hydrocarbon group, the number of carbon atoms of the aliphatic hydrocarbon group is preferably 10 or more, more preferably 12 or more, and still more preferably 16 or more. The upper limit of the number of carbon atoms of the aliphatic hydrocarbon group is not particularly limited, but is preferably 20 or less, and more preferably 18 or less.

(Anionic Surfactant)

Examples of the anionic surfactant included in the cleaning liquid include phosphonic acid-based surfactants having a phosphonic acid group, sulfonic acid-based surfactants having a sulfo group, carboxylic acid-based surfactants having a carboxyl group, and sulfuric acid ester-based surfactants having a sulfuric acid ester group, respectively, as a hydrophilic group (acid group). Among those, it is preferable that the cleaning liquid includes the anionic surfactant from the viewpoint that the effect of the present invention is more excellent.

—Phosphonic Acid-Based Surfactant—

Examples of the phosphonic acid-based surfactant include an alkylphosphonic acid and a polyvinylphosphonic acid. In addition, other examples thereof include the aminomethylphosphonic acid and the like described in JP2012-057108A.

—Sulfonic Acid-Based Surfactant—

Examples of the sulfonic acid-based surfactant include alkyl sulfonic acid, alkyl benzene sulfonic acid, alkyl naphthalene sulfonic acid, alkyl diphenyl ether disulfonic acid, alkyl methyl taurine, sulfosuccinic acid diester, polyoxyalkylene alkyl ether sulfonic acid, and salts thereof.

The monovalent alkyl group contained in the sulfonic acid-based surfactant is not particularly limited, but is preferably an alkyl group having 10 or more carbon atoms, and more preferably an alkyl group having 12 or more carbon atoms. The upper limit of the number of carbon atoms of the alkyl group is not particularly limited, but is preferably 24 or less.

Moreover, the alkylene group contained in the polyoxyalkylene alkyl ether sulfonic acid is not particularly limited, but is preferably an ethylene group or a 1,2-propanediyl group. In addition, the number of repetitions of the oxyalkylene group in the polyoxyalkylene alkyl ether sulfonic acid is preferably 1 to 12, and more preferably 1 to 6.

Specific examples of the sulfonic acid-based surfactant include hexane sulfonic acid, octane sulfonic acid, decane sulfonic acid, dodecane sulfonic acid, toluene sulfonic acid, cumene sulfonic acid, octylbenzene sulfonic acid, dodecylbenzenesulfonic acid (DBSA), dinitrobenzene sulfonic acid (DNBSA), and lauryldodecylphenyl ether disulfonic acid (LDPEDSA).

Among those, the sulfonic acid-based surfactant having an alkyl group having 10 or more carbon atoms is preferable, the sulfonic acid-based surfactant having an alkyl group having 12 or more carbon atoms is more preferable, and DBSA is still more preferable.

—Carboxylic Acid-Based Surfactant—

Examples of the carboxylic acid-based surfactant include an alkylcarboxylic acid, an alkylbenzenecarboxylic acid, a polyoxyalkylene alkyl ether carboxylic acid, and salts thereof.

The alkyl group contained in the above-mentioned carboxylic acid-based surfactant is not particularly limited, but is preferably an alkyl group having 7 to 25 carbon atoms, and more preferably an alkyl group having 11 to 17 carbon atoms.

Moreover, the alkylene group contained in the polyoxyalkylene alkyl ether carboxylic acid is not particularly limited, but is preferably an ethylene group or a 1,2-propanediyl group. In addition, the number of repetitions of the oxyalkylene group in the polyoxyalkylene alkyl ether carboxylic acid is preferably 1 to 12, and more preferably 1 to 6.

Specific examples of the carboxylic acid-based surfactant include lauric acid, myristic acid, palmitic acid, stearic acid, polyoxyethylene lauryl ether acetic acid, and polyoxyethylene tridecyl ether acetic acid.

—Sulfuric Acid Ester-Based Surfactant—

Examples of the sulfuric acid ester-based surfactant include a sulfuric acid ester (alkyl ether sulfuric acid ester), a polyoxyalkylene ether sulfuric acid ester, and salts thereof.

The alkyl group contained in the sulfuric acid ester and the polyoxyalkylene ether sulfuric acid ester is not particularly limited, but is preferably an alkyl group having 2 to 24 carbon atoms, and more preferably an alkyl group having 6 to 18 carbon atoms.

The alkylene group contained in the polyoxyalkylene ether sulfuric acid ester is not particularly limited, but is preferably an ethylene group or a 1,2-propanediyl group. In addition, the number of repetitions of the oxyalkylene group in the polyoxyalkylene ether sulfuric acid ester is preferably 1 to 12, and more preferably 1 to 6.

Specific examples of the sulfuric acid ester-based surfactant include lauryl sulfate, myristyl sulfate, and polyoxyethylene lauryl ether sulfuric acid.

(Nonionic Surfactant)

Examples of the nonionic surfactant include polyoxyalkylene alkyl ethers (for example, polyoxyethylene stearyl ether), polyoxyalkylene alkenyl ethers (for example, polyoxyethylene oleyl ether), polyoxyethylene alkylphenyl ethers (for example, polyoxyethylene nonylphenyl ether), polyoxyalkylene glycol (for example, polyoxypropylene polyoxyethylene glycol), polyoxyalkylene monoalkylates (monoalkyl fatty acid ester polyoxyalkylene) (for example, polyoxyethylene monoalkylates such as polyoxyethylene monostearate and polyoxyethylene monooleate), polyoxyalkylene dialkylates (dialkyl fatty acid ester polyoxyalkylene) (for example, polyoxyethylene dialkylates such as polyoxyethylene distearate and polyoxyethylene diolate), bispolyoxyalkylene alkylamides (for example, bispolyoxyethylene stearylamide), a sorbitan fatty acid ester, a polyoxyethylene sorbitan fatty acid ester, a polyoxyethylene alkylamine, a glycerin fatty acid ester, an oxyethylene oxypropylene block copolymer, an acetylene glycol-based surfactant, and an acetylene-based polyoxyethylene oxide.

(Cationic Surfactant)

Examples of the cationic surfactant include primary to tertiary alkylamine salts (for example, monostearylammonium chloride, distearylammonium chloride, and tristearylammonium chloride), and modified aliphatic polyamines (for example, polyethylene polyamine).

(Amphoteric Surfactant)

Examples of the amphoteric surfactant include carboxybetaine (for example, alkyl-N,N-dimethylaminoacetic acid betaine and alkyl-N,N-dihydroxyethylaminoacetic acid betaine), sulfobetaine (for example, alkyl-N,N-dimethylsulfoethyleneammonium betaine), and imidazolinium betaine (for example, 2-alkyl-N-carboxymethyl-N-hydroxyethyl imidazolinium betaine).

As the surfactant, the compounds described in paragraphs [0092] to [0096] of JP2015-158662A, paragraphs [0045] and [0046] of JP2012-151273A, and paragraphs [0014] to [0020] of JP2009-147389A, the contents of which are incorporated herein by reference, can also be used.

The surfactant may be used alone or in combination of two or more kinds thereof. In a case where the cleaning liquid includes the surfactant, the content of the surfactant is preferably 0.01% to 5.0% by mass, and more preferably 0.05% to 2.0% by mass with respect to the total mass of the cleaning liquid.

In addition, the content of the surfactant is preferably 0.1% to 40% by mass, and more preferably 1% to 30% by mass with respect to the total mass of the components excluding the solvent in the cleaning liquid.

<pH Adjuster>

The cleaning liquid may include a pH adjuster to adjust and maintain the pH of the cleaning liquid.

Examples of the pH adjuster include a basic compound and an acidic compound other than the components.

—Basic Compound—

Examples of the basic compound include an inorganic base compound other than the above-mentioned organic base compound.

Examples of the inorganic base compound include an alkali metal hydroxide, an alkaline earth metal hydroxide, and ammonia.

Examples of the alkali metal hydroxide include lithium hydroxide, sodium hydroxide, potassium hydroxide, and cesium hydroxide. Examples of the alkaline earth metal hydroxide include calcium hydroxide, strontium hydroxide, and barium hydroxide.

As these basic compounds, commercially available ones may be used, or those appropriately synthesized by a known method may be used.

—Acidic Compound—

Examples of the acidic compound include an inorganic acid.

Examples of the inorganic acid include hydrochloric acid, sulfuric acid, sulfurous acid, nitric acid, nitrite, phosphoric acid, boric acid, and hexafluorophosphoric acid. In addition, a salt of the inorganic acid may be used, and examples thereof include an ammonium salt of the inorganic acid, and more specifically, ammonium chloride, ammonium sulfate, ammonium sulfite, ammonium nitrate, ammonium nitrite, ammonium phosphate, ammonium borate, and ammonium hexafluoride phosphate.

As the inorganic acid, sulfuric acid, phosphoric acid, or phosphate is preferable, and sulfuric acid or phosphoric acid is more preferable.

As the acidic compound, a salt of the acidic compound may be used as long as it is an acid or an acid ion (anion) in an aqueous solution.

As the acidic compound, commercially available ones may be used, or those appropriately synthesized by a known method may be used.

The pH adjuster may be used alone or in combination of two or more kinds thereof.

In a case where the cleaning liquid includes the pH adjuster, the content of the pH adjuster is selected according to types and amounts of other components, and the pH of a desired cleaning liquid, and is preferably 0.01% to 3% by mass, and more preferably 0.05% to 1% by mass with respect to the total mass of the cleaning liquid.

<Additive>

The cleaning liquid may include an additive other than the components.

Examples of the additive include a polymer, a chelating agent, a fluorine compound, and an organic solvent, which are other than the components, and the polymer is preferable.

—Polymer—

The cleaning liquid may include a polymer.

The polymer is a component different from the above-mentioned respective components.

The weight-average molecular weight of the polymer is preferably 200 or more, more preferably 1,000 or more, and still more preferably 2,000 or more. The upper limit is not particularly limited, but is preferably 1,000,000 or less, and more preferably 500,000 or less.

Among those, in a case where the polymer is a water-soluble polymer which will be described below, the weight-average molecular weight of the water-soluble polymer is preferably 200 or more, more preferably 1,500 or more, and still more preferably 3,000 or more. The upper limit of the weight-average molecular weight of the water-soluble polymer is not limited, and is, for example, 1,500,000 or less, preferably 1,200,000 or less, more preferably 1,000,000 or less, and still more preferably 10,000 or less.

It is preferable that the polymer includes at least one selected from the group consisting of a polymer A having a weight-average molecular weight of 500 or more and less than 2,000 and a polymer B having a weight-average molecular weight of 2,000 or more. The upper limit of the molecular weight of the polymer B is not particularly limited, but is preferably 1,000,000 or less, and more preferably 500,000 or less.

Furthermore, in the present specification, the "weight-average molecular weight" refers to a weight-average molecular weight in terms of polyethylene glycol measured by gel permeation chromatography (GPC).

The polymer preferably has a carboxyl group or an acid anhydride group (—CO—O—CO—). More specifically, the polymer preferably has a repeating unit having a carboxyl group (such as a repeating unit derived from a (meth)acrylic acid) or a repeating unit having an acid anhydride group. The content of the repeating unit having a carboxyl group or the acid anhydride group is preferably 30% to 100% by mass, more preferably 70% to 100% by mass, and still more preferably 85% to 100% by mass with respect to the total mass of the polymer.

Among those, the polymer B having a carboxyl group or an acid anhydride group is preferable.

It is also preferable that the polymer is a water-soluble polymer.

Furthermore, the "water-soluble polymer" is intended to be a compound having two or more repeating units linked in a linear or mesh form through a covalent bond, in which the mass of the polymer dissolved in 100 g of water at 20° C. is 0.1 g or more.

Examples of the water-soluble polymer include a polyacrylic acid, a polymethacrylic acid, a polymaleic acid, a polyvinylsulfonic acid, a polyallylsulfonic acid, a polystyrenesulfonic acid, and salts thereof; copolymers of monomers such as styrene, α-methylstyrene, and/or 4-methylstyrene and acid monomers such as a (meth)acrylic acid and/or a maleic acid, and salts thereof; polymers having repeating units having an aromatic hydrocarbon group obtained by fusing benzenesulfonic acid and/or naphthalenesulfonic acid, and the like with formalin; vinyl-based synthetic polymers such as polyvinyl alcohol, polyoxyethylene, polyvinylpyrrolidone, polyvinylpyridine, polyacrylamide, polyvinyl formamide, polyethyleneimine, polyvinyloxazoline, polyvinylimidazole, and polyallylamine; and modified products of natural polysaccharides such as hydroxyethyl cellulose, carboxymethyl cellulose, and processed starch.

The water-soluble polymer may be a homopolymer or a copolymer obtained by copolymerizing two or more kinds of monomers. Examples of such the monomer include monomers selected from the group consisting of a monomer having a carboxyl group, a monomer having a sulfonic acid group, a monomer having a hydroxyl group, a monomer having a polyethylene oxide chain, a monomer having an amino group, and a monomer having a heterocyclic ring.

It is also preferable that the water-soluble polymer is a polymer consisting of only structural units derived from the monomers selected from the group. In a case where the polymer is composed of substantially only a structural unit derived from the monomer selected from the group, for example, the content of the structural unit derived from the monomer selected from the group is preferably 95% to 100% by mass, and more preferably 99% to 100% by mass with respect to the mass of the polymer used.

The polymer may be used alone or in combination of two or more kinds thereof.

In a case where the cleaning liquid includes the polymer, the content of the polymer is preferably 0.01% to 20% by mass, more preferably 0.1% to 10% by mass, and still more preferably 0.3% to 5% by mass with respect to the total mass of the cleaning liquid.

In addition, the content of the polymer is preferably 0.1% to 40% by mass, more preferably 1% to 30% by mass, and still more preferably 5% to 20% by mass with respect to the total mass of the components excluding the solvent in the cleaning liquid.

In a case where the content of the polymer is within the range, the polymer can be appropriately adsorbed on a surface of a substrate to contribute to improvement of the corrosion prevention performance of the cleaning liquid, and can also improve a balance between the viscosity and/or the cleaning performance of the cleaning liquid.

—Polyhydroxy Compound Having Molecular Weight of 500 or More—

The cleaning liquid may include a polyhydroxy compound having a molecular weight of 500 or more.

The polyhydroxy compound is a component different from the above-mentioned respective components.

The polyhydroxy compound is an organic compound having two or more (for example, 2 to 200) alcoholic hydroxyl groups in one molecule.

The molecular weight (weight-average molecular weight in a case of having a molecular weight distribution) of the polyhydroxy compound is 500 or more, and preferably 500 to 3,000.

Examples of the polyhydroxy compound include polyoxyalkylene glycols such as polyethylene glycol, polypropylene glycol, and polyoxyethylene polyoxypropylene glycol; oligosaccharides such as mannitriose, cellotriose, gentianose, raffinose, melezitose, cellotetrose, and stachyose; and polysaccharides such as starch, glycogen, cellulose, xylose, chitin, and chitosan, and hydrolysates thereof.

In addition, cyclodextrin is also preferable as the polyhydroxy compound.

The cyclodextrin is a kind of cyclic oligosaccharide having a cyclic structure in which a plurality of D-glucoses are bonded through a glucoside bond, and is a compound to which 5 or more (for example, 6 to 8) glucoses are bonded.

Examples of the cyclodextrin include α-cyclodextrin, β-cyclodextrin and γ-cyclodextrin, and among these, γ-cyclodextrin is preferable.

The polyhydroxy compound may be used alone or in combination of two or more kinds thereof.

In a case where the cleaning liquid includes the polyhydroxy compound, the content of the polyhydroxy compound is preferably 0.01% to 10% by mass, more preferably 0.05% to 5% by mass, and still more preferably 0.1% to 3% by mass with respect to the total mass of the cleaning liquid.

In addition, the content of the polyhydroxy compound is preferably 0.1% to 40% by mass, more preferably 1% to 30% by mass, and still more preferably 5% to 20% by mass with respect to the total mass of the components excluding the solvent in the cleaning liquid.

The chelating agent is not particularly limited as long as it is other than the above-described organic acid having a chelating function. Examples of such another chelating agent include inorganic acid-based chelating agents such as a fused phosphoric acid and a salt thereof. Examples of the fused phosphoric acid and a salt thereof include pyrophosphoric acid and a salt thereof, metaphosphoric acid and a salt thereof, tripolyphosphoric acid and a salt thereof, and hexametaphosphoric acid and a salt thereof.

Examples of the fluorine compound include the compounds described in paragraphs [0013] to [0015] of JP2005-150236A, the contents of which are incorporated herein by reference.

As the organic solvent (sometimes referred to as the solvent), any of known organic solvents can be used, but hydrophilic organic solvents such as an alcohol and a ketone are preferable.

The additive may be used alone or in combination of two or more kinds thereof.

The content of the additive is not particularly limited, but the content is preferably 0.01% to 20% by mass, more preferably 0.1% to 10% by mass, and still more preferably 0.3% to 5% by mass with respect to the total mass of the cleaning liquid.

In addition, the content of the additive is preferably 0.1% to 40% by mass, more preferably 1% to 30% by mass, and still more preferably 5% to 20% by mass with respect to the total mass of the components excluding the solvent in the cleaning liquid.

<Water>

The cleaning liquid preferably includes water as the solvent.

The type of water used for the cleaning liquid is not particularly limited as long as it does not adversely affect a semiconductor substrate, and distilled water, deionized water, and pure water (ultrapure water) can be used. Pure water (ultrapure water) is preferable from the viewpoints that substantially no impurities are included there is less influence on a semiconductor substrate in a step of producing the semiconductor substrate.

The content of water in the cleaning liquid may be a balance other than the perhalogen acid, the halogen acid, or the above-described optional components. The content of water, is, for example, preferably 1% by mass or more, more preferably 30% by mass or more, still more preferably 60% by mass or more, and particularly preferably 85% by mass or more with respect to the total mass of the cleaning liquid. The upper limit is not particularly limited, but is preferably 99% by mass or less, and more preferably 98% by mass or less with respect to the total mass of the cleaning liquid.

[Physical Properties of Cleaning Liquid]

<Metal Content>

In the cleaning liquid, the content of metals (metal elements of Fe, Co, Na, K, Cu, Mg, Mn, Li, Al, Cr, Ni, Zn, Sn, and Ag) included as impurities in the liquid (as measured as an ion concentration) is preferably 5 ppm by mass or less, and more preferably 1 ppm by mass or less. In a view that high-purity cleaning liquids are further demanded in the manufacture of state-of-the-art semiconductor elements, the content of a metal is still more preferably a value of less than 1 ppm by mass, that is, a mass of ppb order or less, and particularly preferably 100 ppb by mass or less, and most preferably less than 10 ppb by mass. The lower limit is not particularly limited, but is preferably 0.

Examples of a method for reducing the metal content include performing a purifying treatment such as distillation and filtration using an ion exchange resin or a filter at a stage of raw materials used in the production of the cleaning liquid or a stage after the production of the cleaning liquid.

Other examples of the method for reducing the metal content include using a container with less elution of impurities, which will be described later as a container that accommodates the raw material or the produced cleaning liquid. In addition, other examples of the method include lining an inner wall of a pipe with a fluorine-based resin so that the metal component does not elute from the pipe and the like during the production of the cleaning liquid.

<Coarse Particles>

The cleaning liquid may include coarse particles, but the content of the cleaning liquid is preferably low. Here, the coarse particles mean particles having a diameter (particle diameter) of 0.4 μm or more in a case where the shape of the particles is regarded as a sphere.

As for the content of the coarse particles in the cleaning liquid, the content of the particles having a particle diameter of 0.4 μm or more is preferably 1,000 or less, and more preferably 500 or less per mL of the cleaning liquid. The lower limit is not particularly limited, and may be 0. In addition, it is more preferable that the content of particles having a particle diameter of 0.4 μm or more measured by the following measuring method is no more than a detection limit value.

The coarse particles included in the cleaning liquid correspond to particles of dirt, dust, organic solids, inorganic solids, and the like included as impurities in raw materials, and particles of dirt, dust, and organic solids, and inorganic solids brought in as contaminants during the preparation of the cleaning liquid, in which the particles are finally present as particles without being dissolved in the cleaning liquid.

The content of the coarse particles present in the cleaning liquid can be measured in a liquid phase by using a commercially available measuring device in a light scattering type liquid particle measuring method using a laser as a light source.

Examples of a method for removing the coarse particles include a purifying treatment such as filtering which will be described later.

The cleaning liquid may be used in the form of a kit having raw materials of the cleaning liquid divided into a plurality of parts.

[Production of Cleaning Liquid]

The cleaning liquid can be produced by a known method. Hereinafter, a method for producing the cleaning liquid will be described in detail.

<Liquid Producing Step>

The method for producing a cleaning liquid is not particularly limited, and for example, a cleaning liquid can be produced by mixing the above-described respective components. The order and/or the timing of mixing the above-mentioned respective components is not particularly limited, and for example, a production method in which a perhalogen acid and a halogen acid, and optional components are added sequentially to a container to which purified pure water has been incorporated, and then the mixture is stirred and mixed while a pH adjuster is added to the mixture to adjust the pH of the mixed solution, thereby performing the preparation, may be mentioned. In addition, in a case where water and the respective components are added to the container, they may be added all at once or dividedly a plurality of times.

A stirring device and a stirring method used for producing a cleaning liquid are not particularly limited, and a known device as a stirrer or a disperser may be used. Examples of the stirrer include an industrial mixer, a portable stirrer, a mechanical stirrer, and a magnetic stirrer. Examples of the disperser include an industrial disperser, a homogenizer, an ultrasonic disperser, and bead mills.

The mixing of the respective components in the liquid producing step for the cleaning liquid, and a purifying treatment which will be described later and the storage of the produced cleaning liquid are preferably performed at 40° C. or lower, and more preferably at 30° C. or lower. In addition, the temperature is preferably 5° C. or higher, and more preferably 10° C. or higher. By producing, treating, and/or storing the cleaning liquid in the temperature range, stable performance can be maintained for a long period of time.

(Purifying Treatment)

It is preferable to subject any one or more of the raw materials for preparing the cleaning liquid to a purifying treatment in advance. The purifying treatment is not particularly limited, and examples thereof include known methods such as distillation, ion exchange, and filtration.

The degree of purification is not particularly limited, but it is preferable to perform the purification until a purity of the raw material is 99% by mass or more, and it is more preferable to perform the purification until the purity of the stock solution is 99.9% by mass or more.

Specific examples of the method for the purifying treatment include a method of passing a raw material through an ion exchange resin or a reverse osmosis membrane (RO membrane), and the like, distillation of a raw material, and filtering which will be described later.

As the purifying treatment, a plurality of the above-mentioned purification methods may be combined and carried out. For example, the raw materials are subjected to primary purification by passing through an RO membrane, and then subjected to secondary purification by passing through a purification device consisting of a cation exchange resin, an anion exchange resin, or a mixed bed type ion exchange resin.

In addition, the purifying treatment may be carried out a plurality of times.

(Filtering)

The filter is not particularly limited as long as it is a filter which has been used in filtering applications and the like from the related art. Examples thereof include a filter formed with a fluorine-based resin such as polytetrafluoroethylene (PTFE) and a tetrafluoroethylene-perfluoroalkyl vinyl ether copolymer (PFA), a polyamide-based resin such as nylon, and a polyolefin resin (including a high-density polyolefin and an ultrahigh-molecular-weight polyolefin) such as polyethylene and polypropylene (PP). Among these materials, a material selected from the group consisting of the polyethylene, the polypropylene (including a high-density polypropylene), the fluorine-based resin (including PTFE and PFA), and the polyamide-based resin (including nylon) is preferable, and among these, a filter of the fluorine-based resins are more preferable. By performing filtering of the raw materials using a filter formed with these materials, high-polarity foreign matters which are likely to cause defects can be more effectively removed.

The critical surface tension of the filter is preferably 70 to 95 mN/m, and more preferably 75 to 85 mN/m. Furthermore, the value of the critical surface tension of the filter is a nominal value of a manufacturer. By using a filter having a critical surface tension in the range, high-polarity foreign matters which are likely to cause defects can be more effectively removed.

The pore diameter of the filter is preferably 2 to 20 nm, and more preferably 2 to 15 nm. By adjusting the pore diameter of the filter to be in the range, it is possible to reliably remove fine foreign matters such as impurities and aggregates included in the raw materials while suppressing clogging in filtering. With regard to the pore diameters herein, reference can be made to nominal values of filter manufacturers.

Filtering may be performed only once or twice or more. In a case where filtering is performed twice or more, the filters used may be the same as or different from each other.

Moreover, the filtering is preferably performed at room temperature (25° C.) or lower, more preferably performed at 23° C. or lower, and still more preferably performed at 20° C. or lower. In addition, the temperature is preferably 0° C. or higher, more preferably 5° C. or higher, and still more preferably 10° C. or higher. By performing filtering in the temperature range, the amount of particulate foreign matter and impurities dissolved in the raw material can be reduced, and the foreign matter and impurities can be efficiently removed.

(Container)

The cleaning liquid (including aspects of the kit or a diluent which will be described later) can be filled in any container and stored, transported, and used as long as there is no problem in corrosiveness.

In semiconductor applications, as the container, a container that has a high degree of cleanliness inside the container, and suppresses elution of impurities from an inner wall of an accommodating portion of the container into each liquid is preferable. Examples of such a container include various containers commercially available as a container for a semiconductor cleaning liquid, such as "Clean Bottle" series manufactured by AICELLO MILIM CHEMICAL Co., Ltd. and "Pure Bottle" manufactured by Kodama Plastics Co., Ltd., but the container is not limited thereto.

In addition, as the container for accommodating the cleaning liquid, a container in which a liquid contact portion with each liquid, such as an inner wall of the accommodating portion, is formed from a fluorine-based resin (perfluororesin) or a metal which has been subjected to rust prevention and metal elution prevention treatments is preferable.

The inner wall of the container is preferably formed from one or more resins selected from the group consisting of a polyethylene resin, a polypropylene resin, and a polyethylene-polypropylene resin, other resins, and a metal which has been rust prevention and metal elution preventing treatments, such as stainless steel, Hastelloy, Inconel, and Monel.

As such other resins, a fluorine-based resin (perfluororesin) is preferable. In this manner, by using a container having an inner wall formed of a fluorine-based resin, occurrence of a problem of elution of ethylene or propylene oligomers can be suppressed, as compared with a container having an inner wall formed of a polyethylene resin, a polypropylene resin, or a polyethylene-polypropylene resin.

Specific examples of such a container having an inner wall which is a fluorine-based resin include a FluoroPurePFA composite drum manufactured by Entegris Inc. In addition, the containers described on page 4 of JP1991-502677A (JP-H03-502677A), page 3 of WO2004/016526A, and pages 9 and 16 of WO99/46309A can also be used.

Moreover, for the inner wall of the container, quartz and an electropolished metal material (that is, a completely electropolished metal material) are also preferably used, in addition to the above-mentioned fluorine-based resin.

The metal material used for producing the electropolished metal material is preferably a metal material which includes at least one selected from the group consisting of chromium and nickel, and has a total content of chromium and nickel of more than 25% by mass with respect to the total mass of the metal material, and examples thereof include stainless steel and a nickel-chromium alloy.

The total content of chromium and nickel in the metal material is more preferably 30% by mass or more with respect to the total mass of the metal material.

In addition, the upper limit value of the total content of Cr and Ni in the metal material is not particularly limited, but is generally preferably 90% by mass or less.

A method for electropolishing the metal material is not particularly limited, and a known method can be used. For example, the methods described in paragraphs [0011] to [0014] of JP2015-227501A, paragraphs [0036] to [0042] of JP2008-264929A, or the like can be used.

The inside of these containers is preferably cleaned before the cleaning liquid is filled. For the liquid used for the cleaning, the amount of the metal impurities in the liquid is preferably reduced. The cleaning liquid may be bottled in a container such as a gallon bottle and a coated bottle after the production, and transported, and stored.

In order to prevent the change in the components in the cleaning liquid during the storage, the inside of the container may be replaced with inert gas (nitrogen, argon, or the like) with a purity of 99.99995% by volume or more. In particular, a gas having a low moisture content is preferable. In addition, during the transportation and the storage, the temperature may be controlled to a normal temperature in the range of −20° C. to 20° C. to prevent deterioration.

(Clean Room)

It is preferable that handlings including production of the cleaning liquid, opening and cleaning of a container, and filling of the cleaning liquid, treatment analysis, and measurements are all performed in a clean room. It is preferable that the clean room satisfies 14644-1 clean room standards. It is preferable that the clean room satisfies any one of International Organization for Standardization (ISO) Class 1, ISO Class 2, ISO Class 3, or ISO Class 4, it is more preferable that the clean room satisfies ISO Class 1 or ISO Class 2, and it is still more preferable that the clean room satisfies ISO Class 1.

<Diluting Step>

It is preferable that the above-described cleaning liquid is subjected to a diluting step of performing dilution with a diluent such as water and then used for cleaning the semiconductor substrate.

A dilution ratio of the cleaning liquid in the diluting step may be appropriately adjusted according to a type and a content of each component, a semiconductor substrate as an object to be cleaned, and the like but the ratio by volume of the dilution cleaning liquid to the cleaning liquid before dilution is preferably 10 to 10,000, more preferably 20 to 3,000, and still more preferably 50 to 1,000.

In addition, the cleaning liquid is preferably diluted with water from the viewpoint that the effect of the present invention is more excellent.

A specific method for the diluting step of diluting the cleaning liquid is not particularly limited, and may be performed according to the above-mentioned liquid producing step for the cleaning liquid. The stirring device and the stirring method used in the diluting step are also not particularly limited, and the known stirring device mentioned in the liquid producing step for the cleaning liquid may be used to perform the dilution.

It is preferable to subject the water used in the diluting step to a purification step in advance. In addition, it is preferable to subject a diluted cleaning liquid obtained in a diluting step to a purifying treatment.

The purifying treatment is not particularly limited, and examples thereof include an ion component reducing treatment using an ion exchange resin, an RO membrane, or the like, and foreign matter removal using filtering, described as the above-mentioned purifying treatment for the cleaning liquid, and it is preferable to carry out any one of the treatments.

[Use of Cleaning Liquid]

The cleaning liquid is used in a cleaning step of cleaning a semiconductor substrate that has been subjected to a chemical mechanical polishing (CMP) treatment. In addition, the cleaning liquid can also be used for cleaning a semiconductor substrate in a process for manufacturing a semiconductor substrate.

Among those, in a case where the semiconductor substrate includes an Ru-containing substance and an $RuO_2$-containing substance, the present treatment method is suitably used.

For the cleaning of the semiconductor substrate, a diluted cleaning liquid obtained by diluting the cleaning liquid may be used.

[Object to be Cleaned]

Examples of an object to be cleaned by the cleaning liquid include a semiconductor substrate having a metal-containing substance.

Furthermore, the expression "on the semiconductor substrate" in the present specification encompasses, for example, front and back surfaces, a side surface, and the inside of a groove of the semiconductor substrate. In addition, the metal-containing substance on the semiconductor substrate encompasses not only a case where the metal-containing substance is directly on a surface of the semiconductor substrate but also a case where the metal-containing substance is present on the semiconductor substrate through another layer.

As the object to be cleaned, a semiconductor substrate containing at least one selected from the group consisting of an Ru-containing substance and an $RuO_2$-containing substance is preferable. Examples of the above-described semiconductor substrate include a laminate of an Ru-containing substance and an $RuO_2$-containing layer formed on a surface layer of the Ru-containing substance.

Examples of the metal included in the metal-containing substance include at least one metal M selected from the group consisting of ruthenium (Ru), copper (Cu), cobalt (Co), tungsten (W), titanium (Ti), tantalum (Ta), chromium (Cr), hafnium (Hf), osmium (Os), platinum (Pt), nickel (Ni), manganese (Mn), zirconium (Zr), molybdenum (Mo), lantern (La), and iridium (Ir).

The metal-containing substance only needs to be a substance including a metal (metal atom), and examples thereof include a simple substance of the metal M, an alloy including the metal M, an oxide of the metal M, a nitride of the metal M, and an acid nitride of the metal M.

In addition, the metal-containing substance may be a mixture including two or more of these compounds.

Furthermore, the oxide, the nitride, and the oxynitride may be a composite oxide, a composite nitride, or a composite oxynitride, including a metal.

The content of the metal atom in the metal-containing substance is preferably 10% by mass or more, more preferably 30% by mass or more, and still more preferably 50% by mass or more with respect to the total mass of the metal-containing substance. The upper limit is 100% by mass or less since the metal-containing substance may be the metal itself.

The semiconductor substrate preferably has a metal M-containing substance including a metal M, and more preferably has a metal-containing substance including at least one metal selected from the group consisting of Ru, Cu, Co, W, Ti, and Ta, still more preferably has a metal-containing substance including at least one metal selected from the group consisting of Ru, Cu, Co, Ti, Ta, and W, and particularly preferably has a metal-containing substance including Ru.

The semiconductor substrate to be cleaned by the cleaning liquid is not particularly limited, and examples thereof include a substrate having a metal wiring line film, a barrier metal, and an insulating film on a surface of a wafer constituting the semiconductor substrate.

Specific examples of the wafer constituting a semiconductor substrate include a wafer consisting of a silicon-based material, such as a silicon (Si) wafer, a silicon carbide (SiC) wafer, and a silicon-including resin-based wafer (glass epoxy wafer), a gallium phosphorus (GaP) wafer, a gallium arsenic (GaAs) wafer, and an indium phosphorus (InP) wafer.

The silicon wafer may be an n-type silicon wafer in which a silicon wafer is doped with a pentavalent atom (for example, phosphorus (P), arsenic (As), and antimony (Sb)), and a p-type silicon wafer in which a silicon wafer is doped with a trivalent atom (for example, boron (B) and gallium (Ga)). The silicon of the silicon wafer may be, for example, any one of amorphous silicon, single crystal silicon, polycrystalline silicon, and polysilicon.

Among those, the cleaning liquid is useful for a wafer consisting of a silicon-based material, such as a silicon wafer, a silicon carbide wafer, and a resin-based wafer including silicon (glass epoxy wafers).

The semiconductor substrate may have an insulating film on the wafer.

Specific examples of the insulating film include a silicon oxide film (for example, a silicon dioxide ($SiO_2$) film, a tetraethyl orthosilicate ($Si(OC_2H_5)_4$) film (TEOS film), a silicon nitride film (for example, silicon nitride ($Si_3N_4$), and silicon nitride carbide (SiNC)), and a low-dielectric-constant (Low-k) film (for example, a carbon-doped silicon oxide (SiOC) film and a silicon carbide (SiC) film).

Examples of the metal film included in the semiconductor substrate include a metal film including at least one metal selected from the group consisting of ruthenium (Ru), copper (Cu), cobalt (Co), and tungsten (W).

The semiconductor substrate preferably has a metal film including at least one selected from the group consisting of ruthenium, copper, and cobalt, and more preferably has a metal film including ruthenium. In addition, it is also preferable that the semiconductor substrate has a metal film including tungsten.

Examples of the ruthenium-containing film include a wiring line film consisting of only metal ruthenium (ruthenium wiring line film), and a wiring line film made of an alloy consisting of metal ruthenium and another metal (ruthenium alloy wiring line film).

Examples of the copper-containing film include a wiring line film consisting of only metal copper (copper wiring line film), and a wiring line film made of an alloy consisting of metal copper and another metal (copper alloy wiring line film).

Specific examples of the copper alloy wiring line film include a wiring line film made of an alloy consisting of one or more metals selected from aluminum (Al), titanium (Ti), chromium (Cr), manganese (Mn), tantalum (Ta), and tungsten (W), and copper. More specific examples of the copper alloy wiring line film include a copper-aluminum alloy wiring line film (CuAl alloy wiring line film), a copper-titanium alloy wiring line film (CuTi alloy wiring line film), a copper-chromium alloy wiring line film (CuCr alloy wiring line film), a copper-manganese alloy wiring line film (CuMn alloy wiring line film), a copper-tantalum alloy wiring line film (CuTa alloy wiring line film), and a copper-tungsten alloy wiring line film (CuW alloy wiring line film).

Examples of the cobalt-containing film (metal film including cobalt as a main component) include a metal film consisting of only metal cobalt (cobalt metal film), and a metal film (cobalt alloy metal film) made of an alloy consisting of metal cobalt and another metal.

Specific examples of the cobalt alloy metal film include a metal film made of an alloy consisting of one or more metals selected from titanium (Ti), chromium (Cr), iron (Fe), nickel (Ni), molybdenum (Mo), palladium (Pd), tantalum (Ta), and tungsten (W), and cobalt. More specific examples of the cobalt alloy metal film include a cobalt-titanium alloy metal film (CoTi alloy metal film), a cobalt-chromium alloy metal film (CoCr alloy metal film), a cobalt-iron alloy metal film (CoFe alloy metal film), a cobalt-nickel alloy metal film (CoNi alloy metal film), a cobalt-molybdenum alloy metal film (CoMo alloy metal film), a cobalt-palladium alloy metal film (CoPd alloy metal film), a cobalt-tantalum alloy metal film (CoTa alloy metal film), and a cobalt-tungsten alloy metal film (CoW alloy metal film).

Examples of the tungsten-containing film (metal film including tungsten as a main component) include a metal film consisting of only tungsten (tungsten metal film) and a metal film made of an alloy consisting of tungsten and another metal (tungsten alloy metal film).

Specific examples of the tungsten alloy metal film include a tungsten-titanium alloy metal film (WTi alloy metal film), and a tungsten-cobalt alloy metal film (WCo alloy metal film).

Generally, the tungsten-containing film is often used as a barrier metal.

A method for forming the insulating film, the copper-containing wiring line film, the cobalt-containing film, and the tungsten-containing film on a wafer constituting the semiconductor substrate is not particularly limited as long as it is a method usually performed in this field.

Examples of a method of forming an insulating film include a method in which a wafer constituting a semiconductor substrate is subjected to a heat treatment in the presence of an oxygen gas to form a silicon oxide film, and then a gas of silane and ammonia is introduced thereto to form a silicon nitride film by a chemical vapor deposition (CVD) method.

Examples of a method for forming a ruthenium-containing wiring line film, a copper-containing wiring line film, a cobalt-containing film, and a tungsten-containing film include a method in which a circuit is formed on a wafer having insulating film by a known method such as a resist, and then a ruthenium-containing wiring line film, a copper-containing wiring line film, a cobalt-containing film, and a tungsten-containing film are formed by a method such as plating and a CVD method.

<CMP Treatment>

The CMP treatment is a treatment in which a surface of a substrate having a metal wiring line film, a barrier metal, and an insulating film is flattened by a combined action of a chemical action using a polishing slurry including polishing fine particles (abrasive grains) and mechanical polishing.

A surface of the semiconductor substrate that has been subjected to the CMP treatment may have impurities remaining thereon, such as abrasive grains (for example, silica and alumina) used in the CMP treatment, a polished metal wiring line film, and metal impurities (metal residue) derived from the barrier metal. For example, since these impurities may short-circuit the wiring lines and deteriorate the electrical characteristics of the semiconductor substrate, the semiconductor substrate that has been subjected to the CMP treatment is subjected to a cleaning treatment for removing these impurities from the surface.

Specific examples of the semiconductor substrate that has been subjected to the CMP treatment include the substrate that has been subjected to a CMP treatment, described in Vol. 84, No. 3, 2018, but the present invention is not limited thereto.

[Method for Cleaning Semiconductor Substrate]

A method for cleaning a semiconductor substrate is not particularly limited as long as it includes a cleaning step of cleaning a semiconductor substrate that has been subjected to a CMP treatment, using the cleaning liquid. The method for cleaning a semiconductor substrate preferably includes a step of applying a diluted cleaning liquid obtained in a diluting step to the semiconductor substrate that has been subjected to a CMP treatment to perform cleaning.

The cleaning step of cleaning the semiconductor substrate using the cleaning liquid is not particularly limited as long as it is a known method to be performed on a semiconductor substrate that has been subjected to a CMP treatment, and cleaning in any of modes usually performed in this field, such as brush scrub cleaning in which a cleaning member such as a brush is physically brought into contact with a surface of the semiconductor substrate while supplying a cleaning liquid to a semiconductor substrate, thereby removing residues; an immersion mode in which a semiconductor substrate is immersed in a cleaning liquid; a spinning (dropping) mode in which a cleaning liquid is dropped while rotating a semiconductor substrate; and a spray mode in which a cleaning liquid is sprayed, may be adopted as appropriate. In the immersion type cleaning, it is preferable to subject the cleaning liquid in which the semiconductor substrate is immersed to an ultrasonic treatment from the viewpoint that impurities remaining on a surface of the semiconductor substrate can be further reduced.

The cleaning step may be performed only once or twice or more. In a case of performing cleaning two or more times, the same method may be repeated or different methods may be combined.

As the method for cleaning the semiconductor substrate, either a single-wafer method or a batch method may be adopted. The single-wafer method is generally a method of treating semiconductor substrates one by one, and the batch method is generally a method of treating a plurality of semiconductor substrates at the same time.

The temperature of the cleaning liquid used for cleaning a semiconductor substrate is not particularly limited as long as it is a temperature usually used in this field. Generally, the cleaning is performed at room temperature (25° C.), but any temperature can be selected in order to improve the cleaning properties and suppress the damage resistance to a member. The temperature of the cleaning liquid is preferably 10° C. to 60° C., and more preferably 15° C. to 50° C.

The cleaning time in cleaning the semiconductor substrate cannot be unequivocally determined since it depends on types, contents, and the like of the components included in the cleaning liquid, but practically, the cleaning time is preferably 10 seconds to 2 minutes, more preferably 20 seconds to 1 minute and 30 seconds, and still more preferably 30 seconds to 1 minute.

The supply amount (supply rate) of the cleaning liquid in the cleaning step for the semiconductor substrate is not particularly limited, but is preferably 50 to 5,000 mL/min, and more preferably 500 to 2,000 mL/min.

In the cleaning of the semiconductor substrate, a mechanical stirring method may be used in order to further improve the cleaning ability of the cleaning liquid.

Examples of the mechanical stirring method include a method of circulating a cleaning liquid on a semiconductor substrate, a method of flowing or spraying a cleaning liquid on a semiconductor substrate, and a method of stirring a cleaning liquid with an ultrasonic or a megasonic.

After cleaning the semiconductor substrate, a step of rinsing and cleaning the semiconductor substrate with a solvent (hereinafter referred to as a "rinsing step") may be performed.

The rinsing step is preferably a step which is performed subsequently after the cleaning step for the semiconductor substrate, and involves rinsing performed with a rinsing liquid over 5 seconds to 5 minutes. The rinsing step may be performed using the above-mentioned mechanical stirring method.

Examples of the rinsing liquid include water (preferably deionized (DI) water), methanol, ethanol, isopropyl alcohol, N-methylpyrrolidinone, γ-butyrolactone, dimethyl sulfoxide, ethyl lactate, and propylene glycol monomethyl ether acetate. In addition, an aqueous rinsing liquid having a pH of more than 8 (aqueous ammonium hydroxide that has been diluted, and the like) may be used.

As a method of bringing the rinsing liquid into contact with the semiconductor substrate, the above-mentioned method of bringing the cleaning liquid into contact with the semiconductor substrate can be similarly applied.

In addition, after the rinsing step, a drying step of drying the semiconductor substrate may be performed.

The drying method is not particularly limited, but include a spin drying method, examples of the drying method include a spin drying method, a method of flowing a dry gas onto a semiconductor substrate, a method of heating a substrate by a heating means such as a hot plate and an infrared lamp, a Marangoni drying method, a Rotagoni drying method, an isopropyl alcohol (IPA) drying method, and any combinations thereof.

EXAMPLES

Hereinbelow, the present invention will be described in more detail with reference to Examples. The materials, the amounts of the materials to be used, the proportions, and the like shown in the Examples below may be modified as appropriate as long as the modifications do not depart from the spirit of the present invention. Therefore, the scope of the present invention should not be construed as being limited to Examples shown below.

In the following Examples, the pH of the cleaning liquid was measured at 25° C. using a pH meter (manufactured by HORIBA, Ltd., model "F-74") in accordance with JIS Z8802-1984.

Furthermore, in the production of cleaning liquids of Examples and Comparative Examples, all of handling of a container, and production, filling, storage, and analytical measurement of the cleaning liquids were performed in a clean room satisfying a level of ISO Class 2 or lower.

[Raw Materials for Cleaning Liquid]

The following compounds were used to produce a cleaning liquid. Furthermore, as various components used in Examples, those all classified into a semiconductor grade or a high-purity grade equivalent thereto were used.

[Perhalogen Acid]

Orthoperiodic acid: manufactured by FUJIFILM Wako Pure Chemical Corporation

[Halogen Acid]

Iodic acid: manufactured by FUJIFILM Wako Pure Chemical Corporation

[Organic Acid]

Diethylenetriamine pentaacetic acid (DTPA): manufactured by FUJIFILM Wako Pure Chemical Corporation Ethylenediaminetetraacetic acid (EDTA): manufactured by Kyrest Co., Ltd.

1-Hydroxyethylidene-1,1-diphosphonic acid (HEDP): "Dequest 2000" manufactured by ThermPhos International BV Citric acid (CA): manufactured by Fuso Chemical Industry Co., Ltd.

[Anticorrosive Agent]

<Phosphoric Acid Ester Acid-Based Surfactant>

$(CH_3)_2Ph\text{-}(OE)_6OPO_3H_2$: manufactured by Takemoto Oil & Fat Co., Ltd., trade name "Phosphanol FS-3PG"

<Heterocyclic Compound>

Azole compound 1: 2,2'-{[(5-Methyl-1H-benzotriazol-1-yl)methyl]imino}diethanol

3-Amino-5-methyl-pyrazole: manufactured by Tokyo Chemical Industry Co., Ltd.

1,2,4-Triazole: manufactured by FUJIFILM Wako Pure Chemical Corporation

[Organic Base Compound]

<First Amine>

2-Amino-2-methyl-1-propanol (AMP): manufactured by FUJIFILM Wako Pure Chemical Corporation <Second Amine>

Tetraethylammonium hydroxide (TEAH): manufactured by FUJIFILM Wako Pure Chemical Corporation Tetrabutylammonium hydroxide (TBAH): manufactured by FUJIFILM Wako Pure Chemical Corporation Tetrapropylammonium hydroxide (TPAH): manufactured by FUJIFILM Wako Pure Chemical Corporation Tetrabutylphosphonium hydroxide (TBPH): manufactured by FUJIFILM Wako Pure Chemical Corporation Diazabicycloundecene (DBU): manufactured by FUJIFILM Wako Pure Chemical Corporation

[pH Adjuster]

Sulfuric acid ($H_2SO_4$): manufactured by FUJIFILM Wako Pure Chemical Corporation

[Additive]

<Polymer>

Polyacrylic acid (Mw=700,000): manufactured by Toagosei Co., Ltd., trade name "Jurymer AC-10H"

Polyacrylic acid (Mw=55,000): manufactured by Toagosei Co., Ltd., trade name "Jurymer AC-10L"

Polyacrylic acid (Mw=6,000): manufactured by Toagosei Co., Ltd., trade name "Aron A-10SL"

Polyacrylic acid (Mw=1,000 or more and less than 2,000): manufactured by Aldrich Co., trade name "Poly(acrylic acid)"

Polymaleic acid (Mw=2,000): manufactured by NOF Corporation, trade name "Nonpol PWA-50W"

[Production of Cleaning Liquid]

Next, a method for producing the cleaning liquid will be described by taking Example 1 as an example.

After adding orthoperiodic acid, iodic acid, tetraethylammonium hydroxide (TEAH), and diazabicycloundecene (DBU) to ultrapure water in amounts having the contents shown in Tables 1 and 2, respectively, and then sulfuric acid was added thereto such that the pH of a cleaning liquid thus prepared was 11. The obtained mixed solution was sufficiently stirred with a stirrer to obtain a cleaning liquid of Example 1.

According to the production method of Example 1, cleaning liquids of Examples 2 to 51 and Comparative Example 1 having the compositions shown in Tables 1 and 2 were each produced.

The "Mass (%)" column in the table shows the content (unit: % by mass) of each component with respect to the total mass of the cleaning liquid.

The numerical value in the column of "ratio" ((A)/(B)) represents the value of a mass ratio of the content of a perhalogen acid to the content of a halogen acid [the content of the perhalogen acid/the content of the halogen acid].

"*1" in the "pH Adjuster" column means that $H_2SO_4$ is added in an amount, as necessary, such that the pH of a cleaning liquid thus prepared reaches the numerical value in the "pH" column.

The "Balance" in the "water" column means that water constitutes a residue other than the components shown in Tables 1 and 2 in the cleaning liquid.

The numerical value in the "pH of cleaning liquid" column indicates a pH of the cleaning liquid at 25° C. as measured by a pH meter.

The numerical value in the column of "pH after dilution" indicates a pH at 25° C. of the cleaning liquid diluted 100-fold by volume with ultrapure water as measured by the pH meter above.

[Evaluation of Removal Performance]

The cleaning liquid produced by the method was used to evaluate the removal performance of a metal film having ruthenium or ruthenium oxide.

2 mL of the cleaning liquid of each Example and each Comparative Example was collected by separation, and diluted 100-fold by volume with ultrapure water to prepare a diluted cleaning liquid (200 mL).

A wafer (with a diameter of 12 inches) having a metal film having ruthenium or ruthenium oxide was cut to prepare each of wafer coupons having a thickness of 10 nm, and a length of 2 cm×a width of 2 cm on the surface.

The wafer coupon was immersed in the diluted cleaning liquid, and each metal film was stirred for 30 minutes at a stirring rotation speed of 250 rpm at room temperature. Each metal film after stirring was observed by the following method, an average value of the lost film thicknesses was calculated, and a removal speed per unit time was calculated. Then, the ratio ($RuO_2$/Ru) of the removal speed for $RuO_2$ to the removal speed for Ru was calculated from the removal speed for each metal film.

For the observation of the surface, a thickness was randomly measured at 100 points using a Review SEM observation device manufactured by Applied Materials technology.

The removal performance for the cleaning liquid was evaluated according to the following evaluation standard. Incidentally, a faster the removal speed for $RuO_2$ is preferable, and a higher ratio of $RuO_2$/Ru is preferable.

($RuO_2$ Evaluation Standard ($RuO_2$ Removal Speed))

A: The removal speed is 2 A/min or more

B: The removal speed is 1 A/min or more and less than 2 A/min

C: The removal speed is less than 1 A/min ($RuO_2$/Ru Evaluation Standard ($RuO_2$/Ru Selection Ratio))

A: $RuO_2$/Ru is 5 or more

B: $RuO_2$/Ru is 3 or more and less than 5

C: $RuO_2$/Ru is 1 or more and less than 3

D: $RuO_2$/Ru is less than 1

TABLE 1

| | Cleaning liquid | | | | | | | | | |
|---|---|---|---|---|---|---|---|---|---|---|
| | Perhalogen acid (A) | | Halogen acid (B) | | | Organic acid | | Anticorrosive agent-Additive | | Organic |
| Table 1-1 | Type | Content % by mass | Type | Content % by mass | Ratio (A)/(B) | Type | Content % by mass | Type | Content % by mass | base compound Type |
| Example 1 | Orthoperiodic acid | 2 | Iodic acid | 0.001 | 2,000 | — | — | — | — | TEAH |
| Example 2 | Orthoperiodic acid | 2 | Iodic acid | 0.003 | 800 | — | — | — | — | TEAH |
| Example 3 | Orthoperiodic acid | 2 | Iodic acid | 0.005 | 400 | — | — | — | — | TEAH |
| Example 4 | Orthoperiodic acid | 2 | Iodic acid | 0.01 | 200 | — | — | — | — | TEAH |
| Example 5 | Orthoperiodic acid | 2 | Iodic acid | 0.1 | 20 | — | — | — | — | TEAH |
| Example 6 | Orthoperiodic acid | 2 | Iodic acid | 1 | 2 | — | — | — | — | TEAH |
| Example 7 | Orthoperiodic acid | 2 | Iodic acid | 2 | 1 | — | — | — | — | TEAH |
| Example 8 | Orthoperiodic acid | 2 | Iodic acid | 4 | 0.25 | — | — | — | — | TEAH |
| Example 9 | Orthoperiodic acid | 2 | Iodic acid | 0.001 | 2,000 | — | — | — | — | TBPH |
| Example 10 | Orthoperiodic acid | 2 | Iodic acid | 0.003 | 800 | — | — | — | — | TBPH |
| Example 11 | Orthoperiodic acid | 2 | Iodic acid | 0.005 | 400 | — | — | — | — | TBPH |
| Example 12 | Orthoperiodic acid | 2 | Iodic acid | 0.01 | 200 | — | — | — | — | TBPH |
| Example 13 | Orthoperiodic acid | 2 | Iodic acid | 0.1 | 20 | — | — | — | — | TBPH |
| Example 14 | Orthoperiodic acid | 2 | Iodic acid | 1 | 2 | — | — | — | — | TBPH |
| Example 15 | Orthoperiodic acid | 2 | Iodic acid | 2 | 1 | — | — | — | — | TBPH |
| Example 16 | Orthoperiodic acid | 1 | Iodic acid | 4 | 0.25 | — | — | — | — | TBPH |
| Example 17 | Orthoperiodic acid | 0.1 | Iodic acid | 4 | 0.03 | — | — | — | — | TEAH |

| | Cleaning liquid | | | | | | | Evaluation | | |
|---|---|---|---|---|---|---|---|---|---|---|
| | Organic base compound | | | pH adjuster | | | | pH | Removal | Selection |
| | Content % by mass | Type | Content % by mass | Type | Content % by mass | Water Content | pH | after dilution | speed for $RuO_2$ | ratio of $RuO_2$Ru |
| Example 1 | 1 | DBU | 0.05 | $H_2SO_4$ | ※1 | Balance | 11 | 10.5 | C | C |
| Example 2 | 1 | DBU | 0.05 | $H_2SO_4$ | ※1 | Balance | 11 | 10.4 | A | C |
| Example 3 | 1 | DBU | 0.05 | $H_2SO_4$ | ※1 | Balance | 11 | 10.5 | A | C |
| Example 4 | 1 | DBU | 0.05 | $H_2SO_4$ | ※1 | Balance | 11 | 10.4 | A | C |
| Example 5 | 1 | DBU | 0.05 | $H_2SO_4$ | ※1 | Balance | 11 | 10.5 | A | B |
| Example 6 | 1 | DBU | 0.05 | $H_2SO_4$ | ※1 | Balance | 11 | 10.3 | A | B |
| Example 7 | 1 | DBU | 0.05 | $H_2SO_4$ | ※1 | Balance | 11 | 10.4 | A | B |
| Example 8 | 1 | DBU | 0.05 | $H_2SO_4$ | ※1 | Balance | 11 | 10.5 | A | A |
| Example 9 | 1 | DBU | 0.05 | $H_2SO_4$ | ※1 | Balance | 11 | 10.5 | C | C |

TABLE 1-continued

| | | | | | | | | | | |
|---|---|---|---|---|---|---|---|---|---|---|
| Example 10 | 1 | DBU | 0.05 | $H_2SO_4$ | ※1 | Balance | 11 | 10.4 | A | C |
| Example 11 | 1 | DBU | 0.05 | $H_2SO_4$ | ※1 | Balance | 11 | 10.5 | A | C |
| Example 12 | 1 | DBU | 0.05 | $H_2SO_4$ | ※1 | Balance | 11 | 10.4 | A | C |
| Example 13 | 1 | DBU | 0.05 | $H_2SO_4$ | ※1 | Balance | 11 | 10.5 | A | B |
| Example 14 | 1 | DBU | 0.05 | $H_2SO_4$ | ※1 | Balance | 11 | 10.3 | A | B |
| Example 15 | 1 | DBU | 0.05 | $H_2SO_4$ | ※1 | Balance | 11 | 10.4 | A | B |
| Example 16 | 1 | DBU | 0.05 | $H_2SO_4$ | ※1 | Balance | 11 | 10.5 | A | A |
| Example 17 | 1 | DBU | 0.05 | $H_2SO_4$ | ※1 | Balance | 11 | 10.4 | A | A |

TABLE 2

| | Cleaning liquid | | | | | | | | | |
|---|---|---|---|---|---|---|---|---|---|---|
| | Perhalogen acid (A) | | Halogen acid (B) | | | Organic acid | | Anticorrosive agent-Additive | | Organic |
| Table 1-2 | Type | Content % by mass | Type | Content % by mass | Ratio (A)/(B) | Type | Content % by mass | Type | Content % by mass | base compound Type |
| Example 18 | Orthoperiodic acid | 0.01 | Iodic acid | 4 | 0.0025 | — | — | — | — | TEAH |
| Example 19 | Orthoperiodic acid | 0.001 | Iodic acid | 4 | 0.0003 | — | — | — | — | TEAH |
| Example 20 | Orthoperiodic acid | 0.0003 | Iodic acid | 4 | 0.0001 | — | — | — | — | TEAH |
| Example 21 | Orthoperiodic acid | 0.0002 | Iodic acid | 4 | 0.00004 | — | — | — | — | TEAH |
| Example 22 | Orthoperiodic acid | 0.001 | Iodic acid | 4 | 0.0003 | — | — | — | — | TEAH |
| Example 23 | Orthoperiodic acid | 0.001 | Iodic acid | 4 | 0.0003 | — | — | — | — | TEAH |
| Example 24 | Orthoperiodic acid | 0.001 | Iodic acid | 4 | 0.0003 | — | — | — | — | TEAH |
| Example 25 | Orthoperiodic acid | 0.001 | Iodic acid | 4 | 0.0003 | — | — | — | — | TEAH |
| Example 26 | Orthoperiodic acid | 0.001 | Iodic acid | 4 | 0.0003 | — | — | — | — | TEAH |
| Example 27 | Orthoperiodic acid | 0.001 | Iodic acid | 4 | 0.0003 | — | — | — | — | TEAH |
| Example 28 | Orthoperiodic acid | 0.001 | Iodic acid | 4 | 0.0003 | — | — | — | — | TEAH |
| Example 29 | Orthoperiodic acid | 0.001 | Iodic acid | 4 | 0.0003 | — | — | — | — | TEAH |
| Example 30 | Orthoperiodic acid | 0.001 | Iodic acid | 4 | 0.0003 | — | — | — | — | — |
| Example 31 | Orthoperiodic acid | 0.001 | Iodic acid | 4 | 0.0003 | — | — | — | — | TEAH |
| Example 32 | Orthoperiodic acid | 0.001 | Iodic acid | 4 | 0.0003 | — | — | — | — | — |
| Example 33 | Orthoperiodic acid | 0.001 | Iodic acid | 4 | 0.0003 | — | — | — | — | TBAH |
| Example 34 | Orthoperiodic acid | 0.001 | Iodic acid | 4 | 0.0003 | — | — | — | — | TPAH |

| | Cleaning liquid | | | | | | | Evaluation | | |
|---|---|---|---|---|---|---|---|---|---|---|
| | Organic base compound | | | pH adjuster | | Water | | pH | Removal | Selection |
| | Content % by mass | Type | Content % by mass | Type | Content % by mass | Content % by mass | pH | after dilution | speed for $RuO_2$ | ratio of $RuO_2$/Ru |
| Example 18 | 1 | DBU | 0.05 | $H_2SO_4$ | ※1 | Balance | 11 | 10.5 | A | A |
| Example 19 | 1 | DBU | 0.05 | $H_2SO_4$ | ※1 | Balance | 11 | 10.5 | B | A |
| Example 20 | 1 | DBU | 0.05 | $H_2SO_4$ | ※1 | Balance | 11 | 10.5 | B | A |
| Example 21 | 1 | DBU | 0.05 | $H_2SO_4$ | ※1 | Balance | 11 | 10.6 | C | A |
| Example 22 | 1 | DBU | 0.2 | $H_2SO_4$ | ※1 | Balance | 14 | 12.1 | C | B |
| Example 23 | 1 | DBU | 0.1 | $H_2SO_4$ | ※1 | Balance | 14 | 11.8 | B | A |
| Example 24 | 1 | — | — | $H_2SO_4$ | ※1 | Balance | 10 | 9.8 | B | A |
| Example 25 | 1 | — | — | $H_2SO_4$ | ※1 | Balance | 8 | 7.5 | B | A |
| Example 26 | 1 | — | — | $H_2SO_4$ | ※1 | Balance | 6 | 6.2 | B | A |
| Example 27 | 1 | — | — | $H_2SO_4$ | ※1 | Balance | 4.5 | 4.8 | B | A |
| Example 28 | 1 | — | — | $H_2SO_4$ | ※1 | Balance | 3 | 3.6 | C | A |
| Example 29 | 1 | — | — | $H_2SO_4$ | ※1 | Balance | 1.5 | 2.5 | C | A |
| Example 30 | — | — | — | $H_2SO_4$ | ※1 | Balance | 1.5 | 2.6 | C | B |
| Example 31 | 1 | — | — | $H_2SO_4$ | ※1 | Balance | 1 | 1.8 | C | B |

TABLE 2-continued

| | | | | | | | | | | |
|---|---|---|---|---|---|---|---|---|---|---|
| Example 32 | — | — | — | $H_2SO_4$ | ※1 | Balance | 1 | 1.8 | C | C |
| Example 33 | 1 | DBU | 0.05 | $H_2SO_4$ | ※1 | Balance | 11 | 10.4 | B | A |
| Example 34 | 1 | DBU | 0.05 | $H_2SO_4$ | ※1 | Balance | 11 | 10.5 | B | A |

TABLE 3

| | Cleaning liquid | | | | | | | | |
|---|---|---|---|---|---|---|---|---|---|
| | Perhalogen acid (A) | | Halogen acid (B) | | | Organic acid | | Anticorrosive agent-Additive | |
| Table 1-3 | Type | Content % by mass | Type | Content % by mass | Ratio (A)/(B) | Type | Content % by mass | Type | Content % by mass |
| Example 35 | Orthoperiodic acid | 0.001 | Iodic acid | 4 | 0.0003 | — | — | — | — |
| Example 36 | Orthoperiodic acid | 0.0002 | | 4 | 0.00004 | DTPA | 0.1 | — | — |
| Example 37 | Orthoperiodic acid | 0.0002 | | 4 | 0.00004 | EDTA | 0.1 | — | — |
| Example 38 | Orthoperiodic acid | 0.0002 | | 4 | 0.00004 | HEDP | 0.1 | — | — |
| Example 39 | Orthoperiodic acid | 0.0002 | | 4 | 0.00004 | CA | 0.1 | — | — |
| Example 40 | Orthoperiodic acid | 0.0002 | | 4 | 0.00004 | DTPA | 0.1 | $(CH_3)_2Ph-(OE)_6OPO_3H_2$ | 1 |
| Example 41 | Orthoperiodic acid | 0.0002 | | 4 | 0.00004 | DTPA | 0.1 | Azole compound 1 | 0.5 |
| Example 42 | Orthoperiodic acid | 0.0002 | | 4 | 0.00004 | DTPA | 0.1 | 3-Amino-5-methyl-pyrazole | 0.5 |
| Example 43 | Orthoperiodic acid | 0.0002 | | 4 | 0.00004 | DTPA | 0.1 | 1,2,4-Triazole | 0.5 |
| Example 44 | Orthoperiodic acid | 0.0002 | | 4 | 0.00004 | Malonic acid | 0.1 | 1,2,4-Triazole | 0.5 |
| Example 45 | Orthoperiodic acid | 0.0002 | | 4 | 0.00004 | Succinic acid | 0.1 | 1,2,4-Triazole | 0.5 |
| Example 46 | Orthoperiodic acid | 0.0002 | | 4 | 0.00004 | Adipic acid | 0.1 | 1,2,4-Triazole | 0.5 |
| Example 47 | Orthoperiodic acid | 0.0002 | | 4 | 0.00004 | DTPA | 0.1 | Polyacrylic acid (Mw = 700,000) | 1 |
| Example 48 | Orthoperiodic acid | 0.0002 | | 4 | 0.00004 | DTPA | 0.1 | Polyacrylic acid (Mw = 55,000) | 1 |
| Example 49 | Orthoperiodic acid | 0.0002 | | 4 | 0.00004 | DTPA | 0.1 | Polyacrylic acid (Mw = 6,000) | 1 |
| Example 50 | Orthoperiodic acid | 0.0002 | | 4 | 0.00004 | DTPA | 0.1 | Polyacrylic acid (Mw = 1,000 or more and less than 2,000) | 1 |
| Example 51 | Orthoperiodic acid | 0.0002 | | 4 | 0.00004 | DTPA | 0.1 | Polyacrylic acid (Mw = 2,000) | 1 |
| Comparative Example 1 | Orthoperiodic acid | 2 | — | — | — | DTPA | 0.1 | $(CH_3)_2Ph-(OE)_6OPO_3H_2$ | 1 |

| | Cleaning liquid | | | | | | | | Evaluation | | |
|---|---|---|---|---|---|---|---|---|---|---|---|
| | Organic base compound | | | | pH adjuster | | | | pH | Removal | Selection |
| | Type | Content % by mass | Type | Content % by mass | Type | Content % by mass | Water Content | pH | after dilution | speed for $RuO_2$ | ratio of $RuO_2Ru$ |
| Example 35 | AMP | 1 | DBU | 0.05 | $H_2SO_4$ | ※1 | Balance | 11 | 10.6 | B | A |
| Example 36 | TEAH | 1 | DBU | 0.05 | $H_2SO_4$ | ※1 | Balance | 11 | 10.5 | B | A |
| Example 37 | TEAH | 1 | DBU | 0.05 | $H_2SO_4$ | ※1 | Balance | 11 | 10.4 | B | A |
| Example 38 | TEAH | 1 | DBU | 0.05 | $H_2SO_4$ | ※1 | Balance | 11 | 10.6 | B | A |
| Example 39 | TEAH | 1 | DBU | 0.05 | $H_2SO_4$ | ※1 | Balance | 11 | 10.5 | B | A |
| Example 40 | TEAH | 1 | DBU | 0.05 | $H_2SO_4$ | ※1 | Balance | 11 | 10.6 | A | A |
| Example 41 | TEAH | 1 | DBU | 0.05 | $H_2SO_4$ | ※1 | Balance | 11 | 10.2 | A | A |
| Example 42 | TEAH | 1 | DBU | 0.05 | $H_2SO_4$ | ※1 | Balance | 11 | 10.7 | A | A |
| Example 43 | TEAH | 1 | DBU | 0.05 | $H_2SO_4$ | ※1 | Balance | 11 | 10.6 | A | A |
| Example 44 | TEAH | 1 | DBU | 0.05 | $H_2SO_4$ | ※1 | Balance | 11 | 10.6 | A | A |
| Example 45 | TEAH | 1 | DBU | 0.05 | $H_2SO_4$ | ※1 | Balance | 11 | 10.6 | A | A |
| Example 46 | TEAH | 1 | DBU | 0.05 | $H_2SO_4$ | ※1 | Balance | 11 | 10.5 | A | A |
| Example 47 | TEAH | 1 | DBU | 0.05 | $H_2SO_4$ | ※1 | Balance | 11 | 10.6 | A | A |
| Example 48 | TEAH | 1 | DBU | 0.05 | $H_2SO_4$ | ※1 | Balance | 11 | 10.6 | A | A |
| Example 49 | TEAH | 1 | DBU | 0.05 | $H_2SO_4$ | ※1 | Balance | 11 | 10.6 | A | A |
| Example 50 | TEAH | 1 | DBU | 0.05 | $H_2SO_4$ | ※1 | Balance | 11 | 10.5 | B | A |

TABLE 3-continued

| | | | | | | | | | | | |
|---|---|---|---|---|---|---|---|---|---|---|---|
| Example 51 | TEAH | 1 | DBU | 0.05 | $H_2SO_4$ | ※1 | Balance | 11 | 10.4 | A | A |
| Comparative Example 1 | TEAH | 1 | DBU | 0.05 | $H_2SO_4$ | ※1 | Balance | 11 | 10.1 | A | D |

Results

As is evident from Tables 1 and 2, it was confirmed that the cleaning liquid of the embodiment of the present invention has an excellent selectivity in the removal performance for $RuO_2$.

From the comparison of Examples 22 to 29 and 31, it was confirmed that the effect was more excellent in a case where the pH value of the cleaning liquid used was 2.0 to 12.0.

From the comparison of Examples 1 to 8 and 17 to 20, it was confirmed that the effect was more excellent in a case where the value of the mass ratio of the content of the perhalogen acid to the content of the halogen acid was 0.00001 to 50.

From the comparison of Examples 29 and 30, it was confirmed that the effect was more excellent in a case where the organic base compound was further included.

From the comparison of Examples 47 to 51, it was confirmed that the effect was more excellent in a case where the polymer B was included.

What is claimed is:

1. A cleaning liquid for a semiconductor substrate that has been subjected to a chemical mechanical polishing treatment, the cleaning liquid comprising:

a perhalogen acid; and a halogen acid, and wherein a value of a mass ratio of a content of the perhalogen acid to a content of the halogen acid is 0.00001 to 0.0025, and the cleaning liquid does not comprise a water-soluble polymer.

2. The cleaning liquid according to claim 1, wherein a pH value of the cleaning liquid is 2.0 to 12.0.

3. The cleaning liquid according to claim 2, further comprising an organic base compound.

4. The cleaning liquid according to claim 3, wherein the organic base compound includes at least one selected from the group consisting of a first amine compound represented by Formula (1), a quaternary ammonium compound, and a quaternary phosphonium compound, (1)

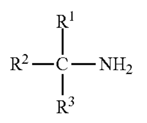

in Formula (1), $R^1$, $R^2$, and $R^3$ all represent organic groups, and a plurality of $R^1$'s, $R^2$'s, and $R^3$'s may be bonded to each other to form a non-aromatic ring which may have a substituent.

5. The cleaning liquid according to claim 2, further comprising an organic acid.

6. The cleaning liquid according to claim 5, wherein the organic acid has at least one selected from the group consisting of a carboxyl group and a phosphonic acid group.

7. The cleaning liquid according to claim 2, further comprising at least one selected from the group consisting of an anticorrosive agent or a surfactant.

8. The cleaning liquid according to claim 2, further comprising an anticorrosive agent, wherein the anticorrosive agent is a heterocyclic compound.

9. The cleaning liquid according to claim 1, further comprising an organic base compound.

10. The cleaning liquid according to claim 9, wherein the organic base compound includes at least one selected from the group consisting of a first amine compound represented by Formula (1), a quaternary ammonium compound, and a quaternary phosphonium compound, (1)

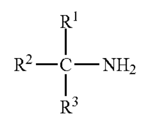

in Formula (1), $R^1$, $R^2$, and $R^3$ all represent organic groups, and a plurality of $R^1$'s, $R^2$'s, and $R^3$'s may be bonded to each other to form a non-aromatic ring which may have a substituent.

11. The cleaning liquid according to claim 1, further comprising an organic acid.

12. The cleaning liquid according to claim 11, wherein the organic acid has at least one selected from the group consisting of a carboxyl group and a phosphonic acid group.

13. The cleaning liquid according to claim 1, further comprising at least one selected from the group consisting of an anticorrosive agent or a surfactant.

14. The cleaning liquid according to claim 1, further comprising an anticorrosive agent, wherein the anticorrosive agent is a heterocyclic compound.

15. The cleaning liquid according to claim 14, wherein the anticorrosive agent includes at least one selected from the group consisting of a tetrazole compound, a triazole compound, an imidazole compound, a pyrazole compound, and a derivative thereof.

16. The cleaning liquid according to claim 1, further comprising a surfactant, wherein the surfactant is an anionic or nonionic surfactant.

17. The cleaning liquid according to claim 1, wherein the content of the halogen acid is 2% to 4.5% by mass with respect to the total mass of the cleaning liquid.

18. The cleaning liquid according to claim 1, wherein a pH value of the cleaning liquid is 10.3 to 14.0.

19. A method for cleaning a semiconductor substrate, comprising a step of cleaning a semiconductor substrate that has been subjected to a chemical mechanical polishing treatment, using the cleaning liquid according to claim 1.

* * * * *